(12) United States Patent
Nosaka

(10) Patent No.: US 10,812,048 B2
(45) Date of Patent: Oct. 20, 2020

(54) ACOUSTIC WAVE FILTER DEVICE, RADIO-FREQUENCY FRONT-END CIRCUIT, AND COMMUNICATION APPARATUS

(71) Applicant: Murata Manufacturing Co., Ltd., Nagaokakyo-shi, Kyoto-fu (JP)

(72) Inventor: Koji Nosaka, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 4 days.

(21) Appl. No.: 16/283,867

(22) Filed: Feb. 25, 2019

(65) Prior Publication Data
US 2019/0190493 A1 Jun. 20, 2019

Related U.S. Application Data

(63) Continuation of application No. PCT/JP2017/031266, filed on Aug. 30, 2017.

(30) Foreign Application Priority Data

Sep. 2, 2016 (JP) .................. 2016-172193

(51) Int. Cl.
*H03H 9/64* (2006.01)
*H03H 7/01* (2006.01)
(Continued)

(52) U.S. Cl.
CPC ........ *H03H 9/6483* (2013.01); *H03H 7/0161* (2013.01); *H03H 9/205* (2013.01);
(Continued)

(58) Field of Classification Search
CPC ............... H03H 9/6483; H03H 7/0161; H03H 9/14541; H03H 9/1457; H03H 9/205;
(Continued)

(56) References Cited

U.S. PATENT DOCUMENTS

| 6,472,953 B1 | 10/2002 | Sakuragawa et al. |
| 2009/0201104 A1 | 8/2009 | Ueda et al. |

(Continued)

FOREIGN PATENT DOCUMENTS

| JP | 2000-323961 A | 11/2000 |
| JP | 2009-207116 A | 9/2009 |

(Continued)

OTHER PUBLICATIONS

PCMag Encyclopedia, p. 1-3, Copyright © 1981-2020. The Computer Language Co Inc. (Year: 2020).*

(Continued)

*Primary Examiner* — Benny T Lee
*Assistant Examiner* — Hafizur Rahman
(74) *Attorney, Agent, or Firm* — Keating & Bennett, LLP

(57) ABSTRACT

A filter includes a series-arm resonator connected on a path connecting input/output terminals, and first and second parallel-arm resonators that are connected between the same node on the path and ground. A resonant frequency of the second parallel-arm resonator is higher than a resonant frequency of the first parallel-arm resonator, and an anti-resonant frequency of the second parallel-arm resonator is higher than an anti-resonant frequency of the first parallel-arm resonator. Each of the first and second parallel-arm resonators is defined by an acoustic wave resonator including an IDT electrode. The IDT electrode in the second parallel-arm resonator has a lower aspect ratio than the IDT electrode in the first parallel-arm resonator, where the aspect ratio is a ratio of an overlap width of electrode fingers to the number of pairs of electrode fingers.

18 Claims, 18 Drawing Sheets

(51) Int. Cl.
  *H03H 9/205* (2006.01)
  *H03H 9/25* (2006.01)
  *H03H 9/72* (2006.01)

(52) U.S. Cl.
  CPC ............ *H03H 9/25* (2013.01); *H03H 9/6403* (2013.01); *H03H 9/725* (2013.01)

(58) Field of Classification Search
  CPC ...... H03H 9/25; H03H 9/6403; H03H 9/6426; H03H 9/725; H03H 9/542
  USPC .................................................. 333/185, 195
  See application file for complete search history.

(56) References Cited

U.S. PATENT DOCUMENTS

| 2011/0095844 | A1 | 4/2011 | Tanaka et al. |
| 2011/0316648 | A1* | 12/2011 | Fujita ................... H03H 9/1452 333/133 |
| 2012/0062329 | A1 | 3/2012 | Yamanaka |
| 2017/0099044 | A1 | 4/2017 | Takamine |
| 2017/0126204 | A1 | 5/2017 | Takamine |
| 2017/0272057 | A1 | 9/2017 | Takata |
| 2019/0190494 | A1 | 6/2019 | Nosaka |

FOREIGN PATENT DOCUMENTS

| JP | 2012-060422 A | 3/2012 |
| JP | 2014-068123 A | 4/2014 |
| WO | 2010/004686 A1 | 1/2010 |
| WO | 2010/103882 A1 | 9/2010 |
| WO | 2016/013330 A1 | 1/2016 |
| WO | 2016/031391 A1 | 3/2016 |
| WO | 2016/088680 A1 | 6/2016 |
| WO | 2018/043607 A1 | 3/2018 |

OTHER PUBLICATIONS

Official Communication issued in International Patent Application No. PCT/JP2017/031266, dated Nov. 21, 2017.

* cited by examiner

ACOUSTIC WAVE FILTER DEVICE, RADIO-FREQUENCY FRONT-END CIRCUIT, AND COMMUNICATION APPARATUS

CROSS REFERENCE TO RELATED APPLICATIONS

This application claims the benefit of priority to Japanese Patent Application No. 2016-172193 filed on Sep. 2, 2016 and is a Continuation Application of PCT Application No. PCT/JP2017/031266 filed on Aug. 30, 2017. The entire contents of each of these applications are hereby incorporated herein by reference.

BACKGROUND OF THE INVENTION

1. Field of the Invention

The present invention relates to an acoustic wave filter device including resonators, a radio-frequency front-end circuit, and a communication apparatus.

2. Description of the Related Art

A known acoustic wave filter device, such as a ladder filter, includes a single parallel arm (parallel-arm resonant circuit) connecting a series arm (series-arm resonant circuit) and ground that is provided with a first parallel-arm resonator and a plurality of second parallel-arm resonators connected in parallel to the first parallel-arm resonator while the plurality of second parallel-arm resonators are connected in series with each other (see, for example, Japanese Unexamined Patent Application Publication No. 2014-68123). In this acoustic wave filter device, the plurality of second parallel-arm resonators have resonant frequencies higher than an anti-resonant frequency of one or more series-arm resonators, and at least one of the plurality of second parallel-arm resonators has an anti-resonant frequency different from an anti-resonant frequency of the other second parallel-arm resonator(s). This configuration enables the acoustic wave filter device to increase the width of an attenuation range having a large attenuation within a specific frequency band in the stop band (attenuation band).

With the recent support for multi-band operation or the like, a filter disposed in a front-end portion of a mobile communication device is required to have low loss and high selectivity (prevention of mutual interference with other bands adjacent to its own band). That is, for filter characteristics, it is required to reduce the loss within the pass band and to improve the steepness of attenuation slopes (called the "sharpness of the pass band edges").

However, in the known acoustic wave filter device described above, filter characteristics are restricted by the Qs of resonators, which makes it difficult to achieve low loss within the pass band and to improve the sharpness on the high-frequency side of the pass band. The improvement in the sharpness on the high-frequency side of the pass band refers to, specifically, the increase in the steepness of a higher-side attenuation slope among two attenuation slopes from the pass band to the attenuation band on both sides of the pass band.

SUMMARY OF THE INVENTION

Preferred embodiments of the present invention provide acoustic wave filter devices, radio-frequency front-end circuits, and communication apparatuses that each are able to achieve low loss within the pass band and improved sharpness on the high-frequency side of the pass band.

An acoustic wave filter device according to a preferred embodiment of the present invention includes a series-arm resonant circuit that is connected on a path connecting a first input/output terminal and a second input/output terminal, and a first parallel-arm resonator and a second parallel-arm resonator that are connected between the same node on the path and ground. A resonant frequency of the second parallel-arm resonator is higher than a resonant frequency of the first parallel-arm resonator, and an anti-resonant frequency of the second parallel-arm resonator is higher than an anti-resonant frequency of the first parallel-arm resonator. Each of the first parallel-arm resonator and the second parallel-arm resonator includes an acoustic wave resonator including an IDT electrode. The IDT electrode in the second parallel-arm resonator has a lower aspect ratio than the IDT electrode in the first parallel-arm resonator, the aspect ratio being a ratio of an overlap width of a plurality of electrode fingers to the number of pairs of electrode fingers.

As a result of intensive research, the inventor of preferred embodiments of the present invention has made the following discoveries. For impedance characteristics of a resonator alone, the lower the aspect ratio of an IDT electrode, the higher the Q at the resonant frequency becomes. Conversely, the higher the aspect ratio of an IDT electrode, the higher the Q at the anti-resonant frequency becomes. For filter characteristics, as the Q at the resonant frequency of the second parallel-arm resonator and the Q at the anti-resonant frequency of the first parallel-arm resonator are increased, a lower loss within the pass band is able to be achieved and the sharpness on the high-frequency side of the pass band is able to be improved. Accordingly, setting the aspect ratio of the IDT electrode in the second parallel-arm resonator to be lower than the aspect ratio of the IDT electrode in the first parallel-arm resonator achieves low loss within the pass band and improved sharpness on the high-frequency side of the pass band.

Further, the overlap width of the IDT electrode in the second parallel-arm resonator may be smaller than the overlap width of the IDT electrode in the first parallel-arm resonator, so that the aspect ratio of the IDT electrode in the second parallel-arm resonator is lower than the aspect ratio of the IDT electrode in the first parallel-arm resonator.

In a resonator, the smaller the overlap width, the smaller the electrode finger resistance. That is, reducing the overlap width reduces series resistance, which may deteriorate the Q at the resonant frequency of the resonator. Accordingly, reducing the overlap width of the IDT electrode in the second parallel-arm resonator achieves lower loss within the pass band and further improved sharpness on the high-frequency side of the pass band.

Further, the number of pairs of the electrode fingers of the IDT electrode in the second parallel-arm resonator may be larger than the number of pairs of the electrode fingers of the IDT electrode in the first parallel-arm resonator, so that the aspect ratio of the IDT electrode in the second parallel-arm resonator is lower than the aspect ratio of the IDT electrode in the first parallel-arm resonator.

As a result of intensive research, the inventor of preferred embodiments of the present invention made the following discoveries. In a frequency band lower than the resonant frequency of a resonator, the smaller the number of pairs of electrode fingers, the larger the ripples (local fluctuations) in the side lobes in the stop band caused by grating. The frequency band lower than the resonant frequency of the second parallel-arm resonator is located in the pass band of the filter. Accordingly, increasing the number of pairs of electrode fingers of the IDT electrode in the second parallel-arm resonator achieves low loss within the pass band and improved sharpness on the high-frequency side of the pass band while reducing ripples in the pass band.

Further, the series-arm resonant circuit may include an acoustic wave resonator including an IDT electrode, and the aspect ratio of the IDT electrode in the series-arm resonant circuit may be lower than the aspect ratio of the IDT electrode in the first parallel-arm resonator.

The pass band of a filter is determined by the resonant frequency of a series-arm resonator and the lower anti-resonant frequency of a parallel-arm resonant circuit (in this aspect, a parallel-connected circuit of the first parallel-arm resonator and the second parallel-arm resonator). As described above, for impedance characteristics of a resonator alone, the lower the aspect ratio of an IDT electrode, the higher the Q at the resonant frequency becomes. Conversely, the higher the aspect ratio of an IDT electrode, the higher the Q at the anti-resonant frequency becomes. Thus, reducing the aspect ratio of the IDT electrode in the series-arm resonator achieves lower loss within the pass band.

Further, the aspect ratio of the IDT electrode in the series-arm resonant circuit may be higher than the aspect ratio of the IDT electrode in the second parallel-arm resonator.

In a resonator (surface acoustic wave resonator) including an IDT electrode, if the overlap width is excessively small, it will lead to an increase in the effect of loss caused by the surface acoustic wave diffraction (diffraction loss). The resonant frequency of the series-arm resonator defines the pass band, and the anti-resonant frequency of the series-arm resonator defines the attenuation pole on the high-frequency side of the pass band. Accordingly, in terms of filter characteristics, there is a limit to the extent to which the overlap width of the series-arm resonator is able to be reduced. In contrast, the resonant frequency of the second parallel-arm resonator defines the attenuation pole on the high-frequency side of the pass band, whereas the anti-resonant frequency of the second parallel-arm resonator does not significantly contribute to the filter characteristics. In addition, diffraction loss occurs in a frequency range higher than the resonant frequency and is thus less likely to affect resonance characteristics. Accordingly, in terms of filter characteristics, there is no particular problem with a reduction in the overlap width of the second parallel-arm resonator.

Accordingly, setting the aspect ratio of the IDT electrode in the series-arm resonator to be higher than the aspect ratio of the IDT electrode in the second parallel-arm resonator is able to reduce or prevent the effect of diffraction loss caused by setting the overlap width of the series-arm resonator to be excessively small. This achieves low loss within the pass band and improved sharpness on the high-frequency side of the pass band while reducing or preventing the deterioration in filter characteristics caused by diffraction loss.

The acoustic wave filter device may further include an impedance circuit in which an impedance element and a switch element are connected in parallel, and at least one of the first parallel-arm resonator and the second parallel-arm resonator may be connected in series with the impedance circuit.

Accordingly, it is possible to provide a tunable filter that switches between a first characteristic and a second characteristic in accordance with the connection or disconnection of the switch element.

Further, the second parallel-arm resonator may be connected in series with the impedance circuit, and the first parallel-arm resonator may be connected in parallel to a circuit in which the second parallel-arm resonator and the impedance circuit are connected in series.

Accordingly, it is possible to provide a tunable filter that switches between a first characteristic and a second characteristic with a reduced or prevented increase in insertion loss at the high-frequency end of the pass band while switching the attenuation pole frequency on the high-frequency side of the pass band in accordance with switching between the connection and disconnection of the switch element.

Alternatively, the first parallel-arm resonator may be connected in series with the impedance circuit, and the second parallel-arm resonator may be connected in parallel to a circuit in which the first parallel-arm resonator and the impedance circuit are connected in series.

Accordingly, it is possible to provide a tunable filter that switches between a first characteristic and a second characteristic with a reduced or prevented increase in insertion loss at the low-frequency end of the pass band while switching the attenuation pole frequency on the low-frequency side of the pass band in accordance with switching between the connection and disconnection of the switch element.

Alternatively, the first parallel-arm resonator and the second parallel-arm resonator may be connected in parallel, and the impedance circuit may be connected in series with a circuit in which the first parallel-arm resonator and the second parallel-arm resonator are connected in parallel.

Accordingly, it is possible to provide a tunable filter that is capable of switching both pole (attenuation pole) frequencies on both sides of the pass band in accordance with switching between the connection and disconnection of the switch element.

The acoustic wave filter device may further include two impedance circuits, each including an impedance element and a switch element that are connected in parallel. The first parallel-arm resonator may be connected in series with one impedance circuit among the two impedance circuits, the second parallel-arm resonator may be connected in series with another impedance circuit among the two impedance circuits, and a circuit in which the first parallel-arm resonator and the one impedance circuit are connected in series and a circuit in which the second parallel-arm resonator and the other impedance circuit may be connected in series are connected in parallel.

Accordingly, it is possible to provide a tunable filter that is capable of switching the attenuation pole frequencies on the high-frequency side of the pass band and the low-frequency side of the pass band in accordance with switching between the connection and disconnection of the switch element and that is capable of reducing or preventing the increase in insertion loss at the high-frequency end of the pass band and at the low-frequency end of the pass band. Thus, such a tunable filter is able to, for example, switch the center frequency while maintaining the band width.

The acoustic wave filter device may further include a switch element connected in parallel to one parallel-arm resonator among the first parallel-arm resonator and the second parallel-arm resonator, and another parallel-arm resonator among the first parallel-arm resonator and the second parallel-arm resonator may be connected in series with a circuit in which the one parallel-arm resonator and the switch element are connected in parallel.

Accordingly, it is possible to provide a tunable filter that is capable of switching the attenuation pole frequency on the low-frequency side of the pass band in accordance with switching between the connection and disconnection of the switch element and that is capable of switching the number of attenuation poles on the high-frequency side of the pass band.

Further, the IDT electrode in the second parallel-arm resonator may have a higher duty ratio than the IDT electrode in the first parallel-arm resonator, the duty ratio being a ratio of a width of a plurality of electrode fingers to a pitch of the plurality of electrode fingers.

As a result of intensive research, the inventor of preferred embodiments of the present invention made the following discoveries. For impedance characteristics of a resonator alone, the higher the duty ratio of an IDT electrode, the higher the Q at the resonant frequency becomes. Conversely, the lower the duty ratio of an IDT electrode, the higher the Q at the anti-resonant frequency becomes. For filter characteristics, as the Q at the resonant frequency of the second parallel-arm resonator and the Q at the anti-resonant frequency of the first parallel-arm resonator are increased, a lower loss within the pass band is able to be achieved and the sharpness on the high-frequency side of the pass band is able to be improved. Accordingly, setting the duty ratio of the IDT electrode in the second parallel-arm resonator to be higher than the duty ratio of the IDT electrode in the first parallel-arm resonator achieves lower loss within the pass band and further improved sharpness on the high-frequency side of the pass band.

Further, the series-arm resonant circuit may be a series-arm resonator including a single acoustic wave resonator, and the series-arm resonant circuit, the first parallel-arm resonator, and the second parallel-arm resonator may define a ladder filter structure.

Accordingly, it is possible to provide a ladder band pass filter and to achieve a steep bandpass characteristic.

Further, the series-arm resonant circuit may be a longitudinally coupled resonator including a plurality of acoustic wave resonators.

Accordingly, filter characteristic requirements, such as attenuation improvement, are able to be satisfied.

A radio-frequency front-end circuit according to a preferred embodiment of the present invention includes an acoustic wave filter device according to a preferred embodiment of the present invention, and an amplifier circuit connected to the acoustic wave filter device.

Accordingly, both low loss and high selectivity (prevention of mutual interference with other bands adjacent to its own band) are able to be achieved.

A communication apparatus according to a preferred embodiment of the present invention includes an RF signal processing circuit that processes a radio-frequency signal transmitted or received by an antenna element, and a radio-frequency front-end circuit according to a preferred embodiment of the present invention that transmits the radio-frequency signal between the antenna element and the RF signal processing circuit.

Acoustic wave filter devices, radio-frequency front-end circuits, and communication apparatuses according to preferred embodiments of the present invention are each able to achieve low loss within the pass band and improved sharpness on the high-frequency side of the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
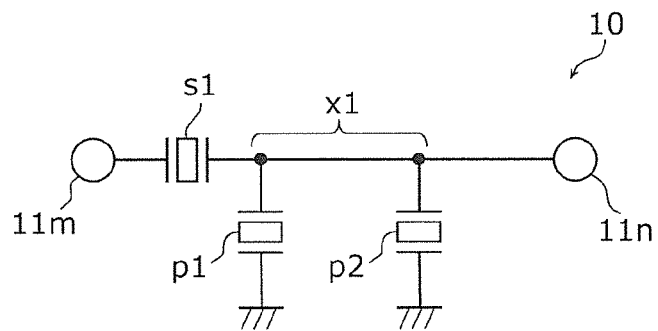
FIG. 1A is a circuit configuration diagram of a filter according to a Preferred Embodiment 1 of the present invention.

Preferred embodiments of the present invention will be described in detail with reference to Examples and the drawings. All of the preferred embodiments described below provide general or specific examples. The values, shapes, materials, elements, the arrangements and connection structures of the elements, and other elements and features, which are provided in the following preferred embodiments, are examples and are not intended to limit the scope of the present invention. The elements described in the following preferred embodiments are described as optional elements unless they are specified in the independent claims. In addition, the elements illustrated in the drawings are not representative of exact proportions or dimensions. Additionally, in the drawings, the same or substantially the same elements are denoted by the same reference numerals, and any redundant description will be omitted or may be briefly provided.

In the following, "the low-frequency end of a pass band" refers to "the lowest frequency in a pass band". Further, "the high-frequency end of a pass band" refers to "the highest frequency in a pass band". In the following, furthermore, "the low-frequency side of a pass band" refers to "frequencies outside a pass band and lower than the pass band". Further, "the high-frequency side of a pass band" refers to "frequencies outside a pass band and higher than the pass band".

Preferred Embodiment 1

FIG. 1A is a circuit configuration diagram of a filter 10 according to a Preferred Embodiment 1 of the present invention.

The filter 10 is preferably a radio frequency filter circuit provided in a front-end portion of a multi-mode/multi-band cellular phone, for example. The filter 10 is preferably, for example, a band pass filter included in a multi-band cellular phone complying with a communication standard such as LTE (Long Term Evolution) and configured to filter radio-frequency signals in a predetermined band. The filter 10 is an acoustic wave filter device that filters radio-frequency signals using acoustic wave resonators.

As illustrated in FIG. 1A, the filter 10 includes a series-arm resonator s1 and parallel-arm resonators p1 and p2.

The series-arm resonator s1 is connected between an input/output terminal 11m (first input/output terminal) and an input/output terminal 11n (second input/output terminal). That is, the series-arm resonator s1 is disposed in a path connecting the input/output terminal 11m and the input/output terminal 11n. The path may be provided with, instead of the series-arm resonator s1, a series-arm resonant circuit including one or more acoustic wave resonators. In the present preferred embodiment, the series-arm resonant circuit includes a single acoustic wave resonator. However, the series-arm resonant circuit may include a plurality of acoustic wave resonators. A series-arm resonant circuit including a plurality of acoustic wave resonators includes, for example, a longitudinally coupled resonator including a plurality of acoustic wave resonators, or a plurality of sub-resonators into which a single acoustic wave resonator is divided in series or in parallel. For example, a longitudinally coupled resonator used as a series-arm resonant circuit is able to satisfy required filter characteristics, such as attenuation improvement.

The parallel-arm resonator p1 is a first parallel-arm resonator connected to a node (in FIG. 1A, a node x1) on the path connecting the input/output terminal 11m and the input/output terminal 11n and to ground (reference terminal). That is, the parallel-arm resonator p1 is disposed in a parallel-arm resonant circuit connecting the node x1 on the path and ground.

The parallel-arm resonator p2 is a second parallel-arm resonator connected to the node (in FIG. 1A, the node x1) on the path connecting the input/output terminal 11m and the input/output terminal 11n and to ground (reference terminal). That is, the parallel-arm resonator p2 is disposed in the parallel-arm resonant circuit connecting the node x1 on the path and ground.

The parallel-arm resonators p1 and p2 are connected between the same node x1 on the path and ground. In the present preferred embodiment, the parallel-arm resonators p1 and p2 are connected in parallel and are connected between the node x1 and ground. As used herein, the term "the same node" is used to include not only a single node on a transmission line but also two different nodes on a transmission line, which are located with no resonator or impedance element therebetween. In the present preferred embodiment, the node x1 is preferably located on the side of the series-arm resonator s1 closer to the input/output terminal 11n. Alternatively, the node x1 may be located on the side of the series-arm resonator s1 closer to the input/output terminal 11m.

Further, the parallel-arm resonators p1 and p2 define a parallel-arm resonant circuit connected between ground and the node x1 on the path connecting the input/output terminal 11m and the input/output terminal 11n. That is, the parallel-arm resonant circuit is disposed in a single path connecting the path and ground. Thus, a series-arm resonant circuit (in the present preferred embodiment, the series-arm resonator s1) and a parallel-arm resonant circuit (in the present preferred embodiment, the parallel-arm resonators p1 and p2) define a ladder filter structure (in the present preferred embodiment, a single-stage ladder filter structure).

That is, the parallel-arm resonant circuit defined by the parallel-arm resonators p1 and p2, and the series-arm resonator s1 define the pass band of the filter 10.

Next, the structure of the filter 10 will be described.

Figure 1B:
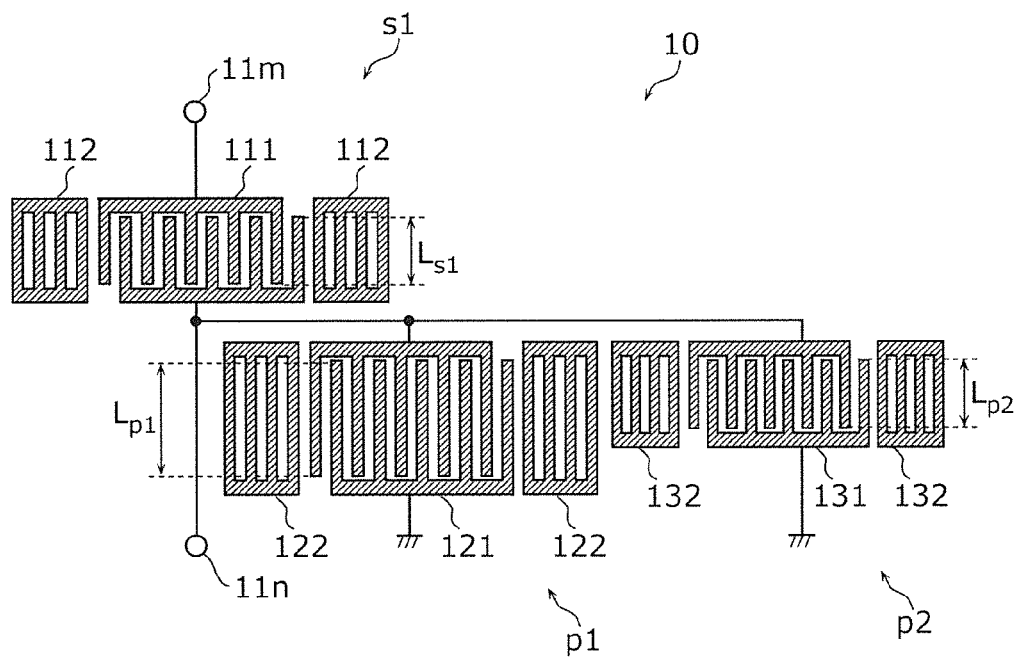
FIG. 1B is a schematic plan view of an electrode structure of the filter according to the Preferred Embodiment 1 of the present invention.

FIG. 1B is a schematic plan view of an electrode structure of the filter 10 according to Preferred Embodiment 1.

As illustrated in FIG. 1B, the resonators included in the filter 10 (the series-arm resonator s1 and the parallel-arm resonators p1 and p2) are each an acoustic wave resonator that uses an acoustic wave. Accordingly, the filter 10 includes IDT (InterDigital Transducer) electrodes on a substrate with piezoelectric properties, and thus a compact, low-profile filter circuit having a bandpass characteristic with improved steepness is able to be obtained. The substrate with piezoelectric properties is a substrate, at least a surface of which has piezoelectric properties. The substrate may preferably be, for example, a multilayer body including a piezoelectric thin film on a surface thereof and a film having a different acoustic velocity from the piezoelectric thin film, a support substrate, and other suitable layers and films. Alternatively, the substrate may preferably be, for example, a multilayer body including a high-acoustic-velocity support substrate and a piezoelectric thin film disposed on the high-acoustic-velocity support substrate, a multilayer body including a high-acoustic-velocity support substrate, a low-acoustic-velocity film disposed on the high-acoustic-velocity support substrate, and a piezoelectric thin film disposed on the low-acoustic-velocity film, or a multilayer body including a support substrate, a high-acoustic-velocity film disposed on the support substrate, a low-acoustic-velocity film disposed on the high-acoustic-velocity film, and a piezoelectric thin film disposed on the low-acoustic-velocity film. The entire substrate may have piezoelectric properties.

Each resonator includes an IDT electrode that excites an acoustic wave, and a pair of reflectors disposed on both sides of the IDT electrode in the acoustic wave propagation direction.

Specifically, the series-arm resonator s1 includes an IDT electrode 111 and a pair of reflectors 112. The parallel-arm resonator p1 includes an IDT electrode 121 and a pair of reflectors 122. The parallel-arm resonator p2 includes an IDT electrode 131 and a pair of reflectors 132.

The resonant frequency (the frequency of a resonant point described below) of the parallel-arm resonator p2 (second parallel-arm resonator) is higher than the resonant frequency of the parallel-arm resonator p1 (first parallel-arm resonator). Further, the anti-resonant frequency (the frequency of an anti-resonant point described below) of the parallel-arm resonator p2 is higher than the anti-resonant frequency of the parallel-arm resonator p1.

Further, the IDT electrode 131 in the parallel-arm resonator p2 has a lower aspect ratio L/N than the IDT electrode 121 in the parallel-arm resonator p1, where the aspect ratio L/N is the ratio of an overlap width L of a plurality of electrode fingers to the number N of pairs of electrode fingers. In the present preferred embodiment, furthermore, the IDT electrode 111 in the series-arm resonator s1 (series-arm resonant circuit) has a lower aspect ratio L/N than the IDT electrode 121 in the parallel-arm resonator p1 and has a higher aspect ratio L/N than the IDT electrode 131 in the parallel-arm resonator p2.

That is, when the overlap widths L of the IDT electrodes 111, 121, and 131 are denoted by $L_{s1}$, $L_{p1}$, and $L_{p2}$, respectively, and the numbers N of pairs of electrode fingers of the IDT electrodes 111, 121, and 131 are denoted by $N_{s1}$, $N_{p1}$, and $N_{p2}$, respectively, then in the present preferred embodiment, the aspect ratio L/N preferably satisfies $L_{p1}/N_{p1} > L_{s1}/N_{s1} > L_{p2}/N_{p2}$.

In FIG. 1B, the numbers of pairs of electrode fingers of the IDT electrodes of the resonators (the IDT electrode 111, the IDT electrode 121, and the IDT electrode 131) are illustrated to be equal. In the actual design, however, it is rare that the numbers of pairs of electrode fingers of the IDT electrodes are equal. That is, design parameters, such as the numbers of pairs of electrode fingers and the overlap widths of the IDT electrodes of the resonators may be determined, as desired, in accordance with specifications required for each resonator.

The following describes the structure of each of the resonators included in the filter 10 in more detail, focusing on a particular one of the resonators. The other resonators have the same or substantially the same structure as the particular resonator and will not be described in detail herein.

Figure 2:
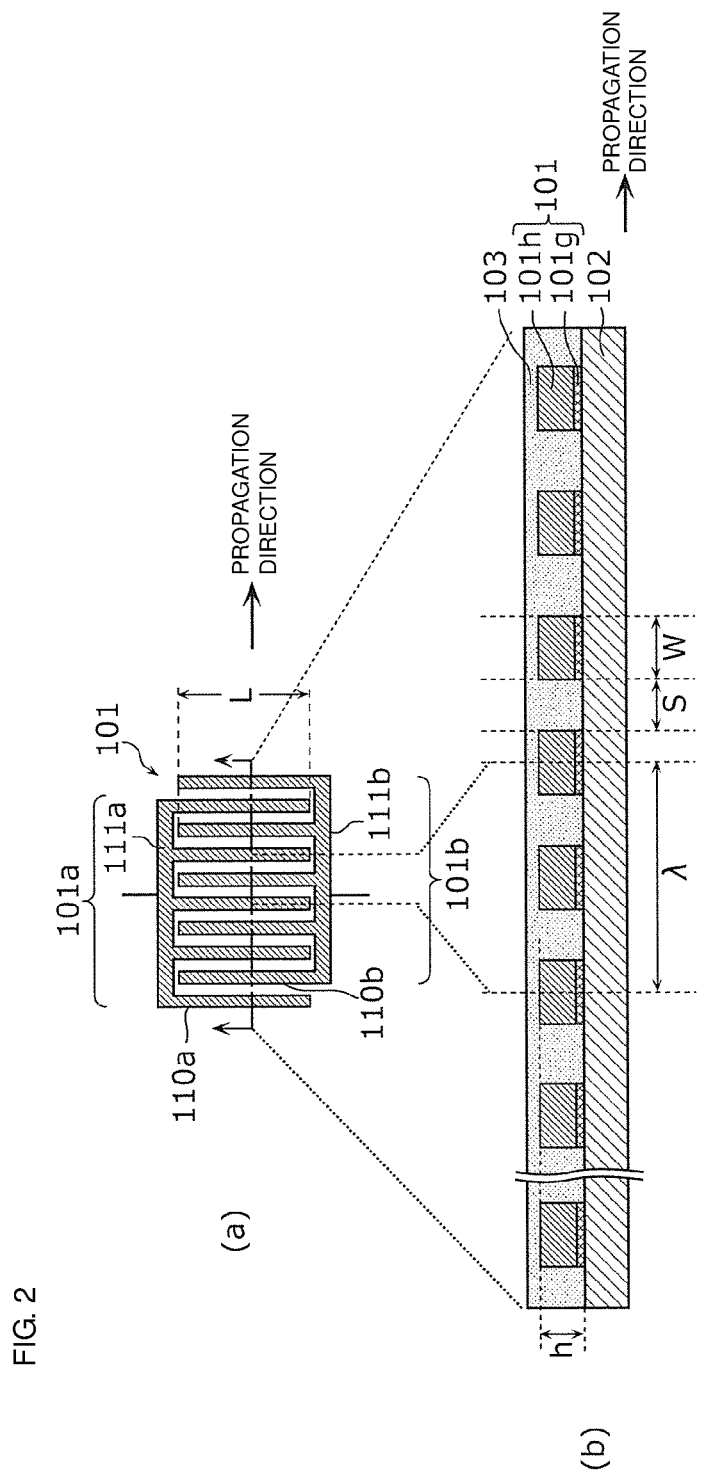
FIG. 2 is an example schematic diagram of the structure of a resonator in the Preferred Embodiment 1 of the present invention.

FIG. 2 is an example schematic diagram of the structure of a resonator in the present preferred embodiment, in which part (a) is a plan view of the resonator and part (b) is a cross-sectional view of the resonator illustrated in part (a).

The resonator illustrated in FIG. 2 is for the purpose of illustration of a typical structure of each of the resonators included in the filter 10. For this reason, the number, length, and other parameters of electrode fingers of an IDT electrode of each resonator in the filter 10 are not limited to the number and length of electrode fingers of an IDT electrode illustrated in FIG. 2. In FIG. 2, reflectors included in the resonator are not illustrated.

As illustrated in parts (a) and (b) of FIG. 2, the resonator includes an IDT electrode 101, a piezoelectric substrate 102 on which the IDT electrode 101 is provided, and a protection layer 103 that covers the IDT electrode 101. These components will be described in detail hereinafter.

As illustrated in part (a) of FIG. 2, a pair of opposing comb electrodes 101a and 101b, which define the IDT electrode 101, are disposed on the piezoelectric substrate 102. The comb electrode 101a includes a plurality of parallel electrode fingers 110a and a busbar electrode 111a that connects the plurality of electrode fingers 110a together. The comb electrode 101b includes a plurality of parallel electrode fingers 110b and a busbar electrode 111b that connects the plurality of electrode fingers 110b together. The pluralities of electrode fingers 110a and 110b extend in a direction perpendicular or substantially perpendicular to the propagation direction.

The comb electrodes 101a and 101b may each be referred to alone as an IDT electrode. In the following description, however, the pair of comb electrodes 101a and 101b define a single IDT electrode 101, for convenience of description.

Further, as illustrated in part (b) of FIG. 2, the IDT electrode 101, which includes the pluralities of electrode fingers 110a and 110b and the busbar electrodes 111a and 111b, has a multilayer structure including a close contact layer 101g and a main electrode layer 101h.

The close contact layer 101g enhances the contact between the piezoelectric substrate 102 and the main electrode layer 101h, and is preferably made of, for example, Ti. The close contact layer 101g preferably has a film thickness of, for example, about 12 nm.

The main electrode layer 101h is preferably made of, for example, Al containing about 1% of Cu. The main electrode layer 101h preferably has a film thickness of, for example, about 162 nm.

The piezoelectric substrate 102 includes the IDT electrode 101 provided thereon and is preferably made of, for example, LiTaO$_3$ piezoelectric single crystal, LiNbO$_3$ piezoelectric single crystal, KNbO$_3$ piezoelectric single crystal, quartz, or piezoelectric ceramics.

The protection layer 103 covers the comb electrodes 101a and 101b. The protection layer 103 protects the main electrode layer 101h from the outside environment, adjusts of the frequency temperature characteristics, and improves humidity resistance, and is preferably a film containing, for example, silicon dioxide as a main component.

A resonator having the configuration described above has a "resonant point", which is a singularity at which the impedance reaches a local minimum (ideally, a point at which the impedance reaches 0), and an "anti-resonant point", which is a singularity at which the impedance reaches a local maximum (ideally, a point at which the impedance becomes infinite).

The structure of each of the resonators included in the filter 10 is not limited to the structure depicted in FIG. 2. For example, the IDT electrode 101 may be a single-layer metal film, rather than having a multilayer structure including metal films. In addition, the materials of the close contact layer 101g, the main electrode layer 101h, and the protection layer 103 are not limited to those described above. Additionally, the IDT electrode 101 may be made of a metal such as Ti, Al, Cu, Pt, Au, Ag, or Pd, or an alloy, or may be made of a plurality of multilayer bodies composed of the metal or alloy, for example. Further, the protection layer 103 is optional.

In a resonator (acoustic wave resonator) having the configuration described above, the design parameters of the IDT electrode 101 define the wavelength of the acoustic wave to be excited. The following describes the design parameters of the IDT electrode 101, that is, the design parameters of the comb electrode 101a and the comb electrode 101b.

The wavelength of the acoustic wave is defined by a repetition period λ of the plurality of electrode fingers 110a or 110b of the comb electrodes 101a and 101b illustrated in FIG. 2. An electrode pitch (electrode period) is equal or substantially equal to ½ of the repetition period λ and is defined by (W+S), where W denotes the line width of the electrode fingers 110a and 110b of the comb electrodes 101a and 101b, and S denotes the width of the space between one of the electrode fingers 110a and one of the electrode fingers 110b, which are adjacent to each other. Further, as illustrated in part (a) of FIG. 2, an overlap width L of the IDT electrode 101 corresponds to the length of an overlap portion of the electrode fingers 110a of the comb electrode 101a and the electrode fingers 110b of the comb electrode 101b when viewed in the acoustic wave propagation direction. Further, an electrode duty (hereinafter, duty ratio) is the proportion of the line width of the pluralities of electrode fingers 110a and 110b, and corresponds to the ratio of the line width of the pluralities of electrode fingers 110a and 110b to the sum of the line width and the space width of the pluralities of electrode fingers 110a and 110b, which is defined by W/(W+S). Further, the number of pairs of electrode fingers refers to the number of paired electrode fingers 110a and 110b of the comb electrodes 101a and 101b, and is approximately half the total number of electrode fingers 110a and 110b. For example, when the number of pairs of electrode fingers is denoted by N and the total number of electrode fingers 110a and 110b is denoted by M, then M=2N+1 is satisfied. That is, the number of regions between the distal end of one electrode finger of one of the comb electrodes 101a and 101b and the busbar electrode of the other comb electrode, which faces the distal end, is equal or substantially equal to 0.5 pairs. Further, the film thickness of the IDT electrode 101 refers to a thickness h of the pluralities of electrode fingers 110a and 110b.

Next, filter characteristics of the filter 10 according to the present preferred embodiment will be described.

In the following, for convenience of description, for not only a resonator alone but also a circuit including a plurality of resonators, a singularity at which the impedance reaches a local minimum (ideally, a point at which the impedance reaches 0) is referred to as "resonant point", and the frequency at this point is referred to as "resonant frequency". Further, a singularity at which the impedance reaches a local maximum (ideally, a point at which the impedance becomes infinite) is referred to as "anti-resonant point", and the frequency at this point is referred to as "anti-resonant frequency".

Figure 3:
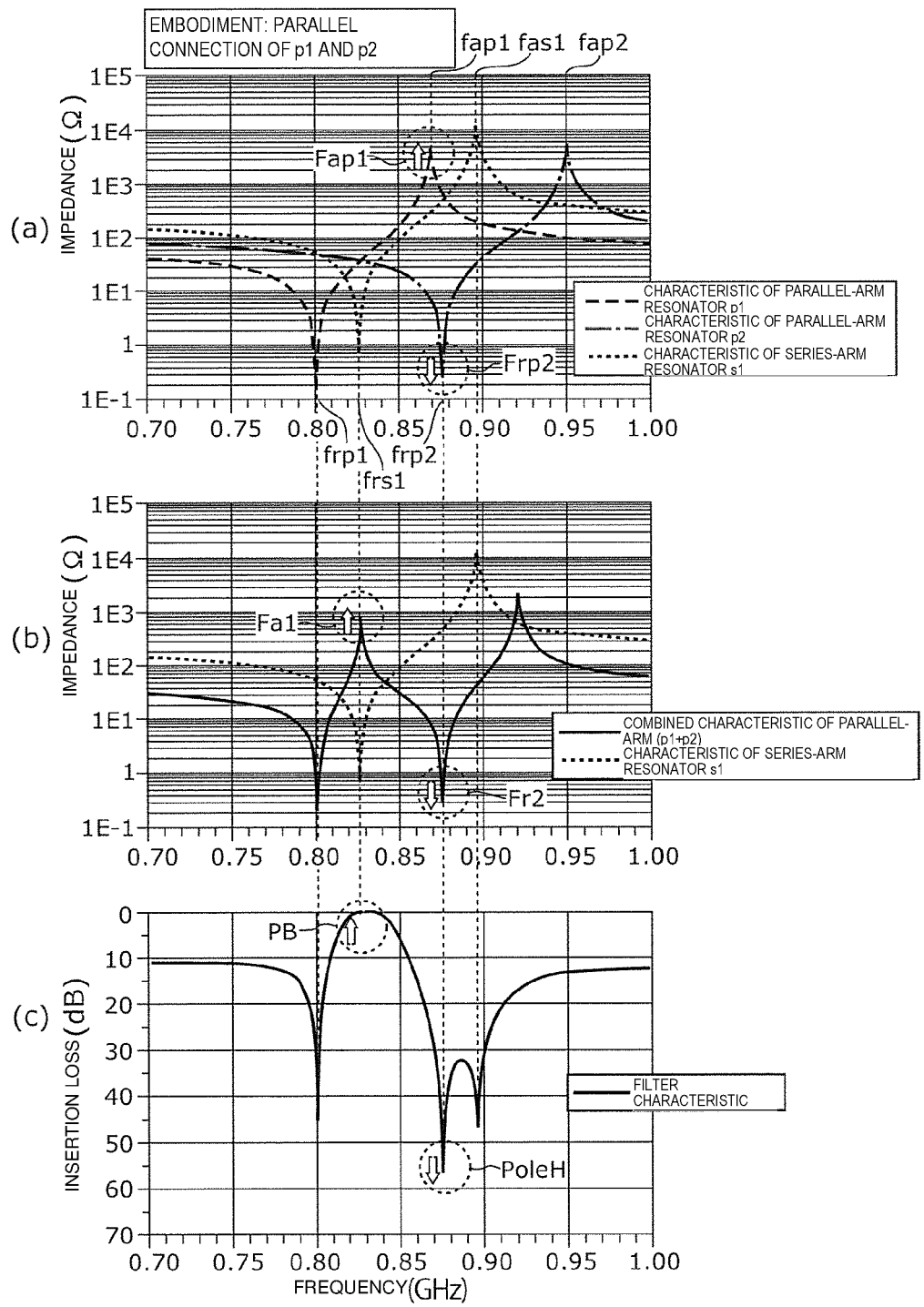
FIG. 3 illustrates graphs depicting characteristics of the filter according to the Preferred Embodiment 1 of the present invention.

FIG. 3 illustrates graphs depicting characteristics of the filter 10 according to the Preferred Embodiment 1. Specifically, part (a) of FIG. 3 is a graph depicting the respective impedance characteristics of the parallel-arm resonators p1 and p2 and the series-arm resonator s1. Part (b) of FIG. 3 is a graph depicting the combined impedance characteristic (combined characteristic) of the parallel-arm resonators p1 and p2 and the impedance characteristic of the series-arm resonator s1. Part (c) of FIG. 3 is a graph depicting a filter characteristic of the filter 10.

First, the impedance characteristics of resonators alone will be described with reference to part (a) of FIG. 3.

As illustrated in part (a) of FIG. 3, the parallel-arm resonator p1, the parallel-arm resonator p2, and the series-arm resonator s1 have the following impedance characteristics. Specifically, when the parallel-arm resonator p1, the parallel-arm resonator p2, and the series-arm resonator s1 have resonant frequencies frp1, frp2, and frs1 and anti-resonant frequencies fap1, fap2, and fas1, respectively, then in the present preferred embodiment, frp1<frs1<frp2 and fap1<fas1<fap2 are satisfied.

Next, the combined characteristic of the parallel-arm resonator p1 and the parallel-arm resonator p2 (i.e., the impedance characteristic of a parallel-arm resonant circuit) will be described.

As illustrated in part (b) of FIG. 3, the combined characteristic of the two parallel-arm resonators (the parallel-arm resonators p1 and p2) ("combined characteristic of parallel-arm (p1+p2)" in FIG. 3) reaches a local minimum at the resonant frequency frp2 of the parallel-arm resonator p2 and at the resonant frequency frp1 of the parallel-arm resonator p1. Further, the combined characteristic reaches a local maximum at a frequency between the two resonant frequencies frp2 and frp1 and at a frequency between the two anti-resonant frequencies fap2 and fap1.

For a band pass filter using ladder resonators, the lower anti-resonant frequency among the two anti-resonant frequencies of the parallel-arm resonant circuit and the resonant frequency frs1 of the series-arm resonator s1 are set to be close to each other to define a pass band.

Accordingly, as illustrated in part (c) of FIG. 3, an attenuation band including the resonant frequency frp1 of the parallel-arm resonator p1 as an attenuation pole is generated on the low-frequency side of the pass band. Further, an attenuation band including the resonant frequency frp2 of the parallel-arm resonator p2 and the anti-resonant frequency fas1 of the series-arm resonator s1 as attenuation poles is generated on the high-frequency side of the pass band.

In the combined impedance characteristic of the parallel-arm resonator p1 and the parallel-arm resonator p2, the lower anti-resonant frequency (Fa1 in FIG. 3) and the higher resonant frequency (Fr2 in FIG. 3) define an attenuation slope on the high-frequency side of the pass band of the filter 10. That is, the sharpness of the attenuation slope on the high-frequency side of the pass band is affected by the sharpness of the slope between the lower anti-resonant frequency (Fa1 in FIG. 3) and the higher resonant frequency (Fr2 in FIG. 3) in the combined impedance characteristic. Thus, the Q at the anti-resonant frequency (Fap1 in FIG. 3) of the parallel-arm resonator p1 and the Q at the resonant frequency (Frp2 in FIG. 3) of the parallel-arm resonator p2 affect the sharpness on the high-frequency side of the pass band. Specifically, as the Q at the anti-resonant frequency of the parallel-arm resonator p1 increases, the Q at the lower anti-resonant frequency (Fa1 in FIG. 3) increases in the combined impedance characteristic of a parallel-arm resonant circuit (in the present preferred embodiment, a parallel-connected circuit including the parallel-arm resonators p1 and p2). In contrast, as the Q at the resonant frequency of the parallel-arm resonator p2 increases, the Q at the higher resonant frequency (Fr2 in FIG. 3) increases in the combined impedance characteristic of the parallel-arm circuit. Accordingly, an improvement in the sharpness of the slope between the lower anti-resonant frequency and the higher resonant frequency (between Fa1 and Fr2 in FIG. 3) in the combined impedance characteristic improves the sharpness on the high-frequency side of the pass band in the filter characteristic described above. In other words, the higher the Q at the resonant frequency of the parallel-arm resonator p2, the higher the Q at the attenuation pole (indicated by PoleH in FIG. 3) on the high-frequency side of the pass band becomes (i.e., the deeper the attenuation pole becomes); the higher the Q at the anti-resonant frequency of the parallel-arm resonator p1, the more the loss within the pass band (indicated by PB in FIG. 3) is reduced. Accordingly, the sharpness on the high-frequency side of the pass band is able to be improved.

Furthermore, near the lower anti-resonant frequency, the combined impedance characteristic of the parallel-arm resonant circuit corresponds to a characteristic obtained by combining the capacitance component of the parallel-arm resonator p2 with the characteristic of the parallel-arm resonator p1. Accordingly, in addition to increasing the Q at the anti-resonant frequency of the parallel-arm resonator p1, increasing the Q of the capacitance component of the parallel-arm resonator p2, that is, reducing the series resistance of the parallel-arm resonator p2, reduces the loss within the pass band of the filter 10.

In the filter 10 according to the present preferred embodiment, as described above, the parallel-arm resonator p2 is includes the IDT electrode 131 having a lower aspect ratio than the IDT electrode 121 in the parallel-arm resonator p1. Accordingly, the filter 10 is able to achieve low loss within the pass band and improved sharpness on the high-frequency frequency and the anti-resonant frequency to change in dependence on the aspect ratio of the IDT electrode is similar to that in the frequency bands in the present preferred embodiment. In the Typical Example 1 described below, furthermore, different numbers of pairs of electrode fingers are provided, with the impedance of a resonator maintained constant (i.e., capacitance maintained constant). Thus, the overlap width is also adjusted in dependence on the number of pairs of electrode fingers.

Figure 4:
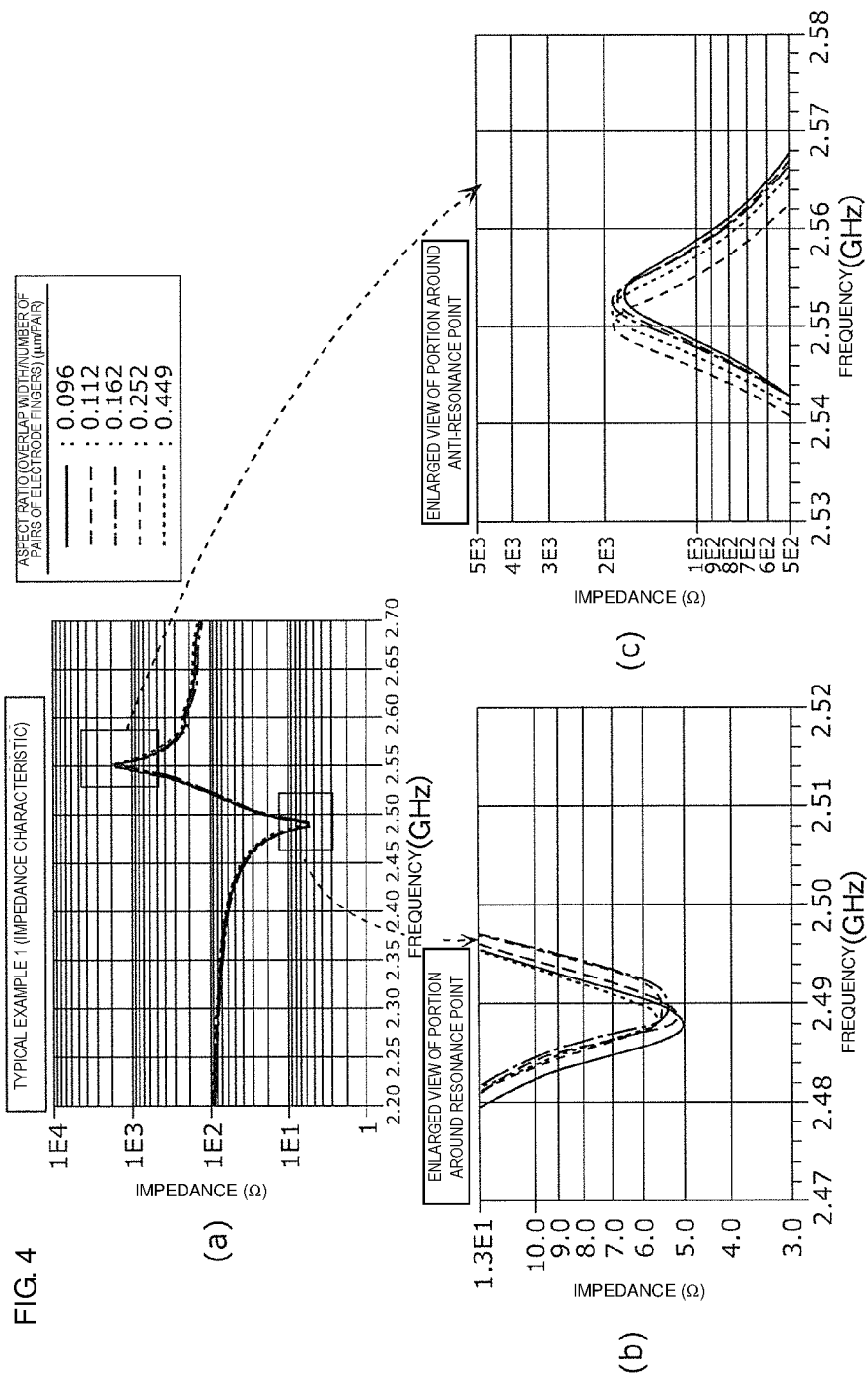
FIG. 4 illustrates graphs depicting impedance characteristics when different aspect ratios are assigned to resonators in a Typical Example 1.

FIG. 4 illustrates graphs depicting impedance characteristics when different aspect ratios are assigned to resonators in the Typical Example 1. In FIG. 4, part (a) depicts the entire impedance characteristics, part (b) is a graph depicting an enlarged view of the impedance characteristics around the resonant frequency illustrated in part (a), and part (c) is a graph depicting an enlarged view of the impedance characteristics around the anti-resonant frequency illustrated in part (a). Specifically, in FIG. 4, impedance characteristics obtained when, as provided in the legends, the aspect ratio (overlap width/number of pairs of electrode fingers) is set to about 0.096, about 0.112, about 0.162, about 0.252, and about 0.449 (all expressed in μm/pair) are illustrated.

Table 1 shows the details of the design parameters of the resonator in this case. In Table 1, "Zmin." represents impedance value at the resonant frequency, that is, a local impedance minimum. In Table 1, further, "Zmax." represents the impedance value at the anti-resonant frequency, that is, a local impedance maximum. Although not provided in Table 1, the film thickness h is the same or substantially the same for all typical examples.

TABLE 1

| Aspect Ratio [μm/pair] | IDT Wavelength λ [μm] | Overlap Width L [μm] | Overlap Width L [wavelength ratio] | Number of Pairs of Electrode Fingers [pair] | Zmin. [Ω] | Zmax. [Ω] |
| --- | --- | --- | --- | --- | --- | --- |
| 0.096 (Typical Example 1-1) | 1.6589 | 24.86 | 15.0 | 260 | 4.99 | 1717.6 |
| 0.112 (Typical Example 1-2) | " | 26.93 | 16.2 | 240 | 5.15 | 1822.7 |
| 0.162 (Typical Example 1-3) | " | 32.31 | 19.5 | 200 | 5.26 | 1865.5 |
| 0.252 (Typical Example 1-4) | " | 40.39 | 24.3 | 160 | 5.54 | 1890.8 |
| 0.449 (Typical Example 1-5) | " | 53.85 | 32.5 | 120 | 5.64 | 1921.0 | side of the pass band. The following describes the reasons for such advantageous effects, together with the circumstances leading to preferred embodiments of the present invention.

In an acoustic wave filter device, generally, due to the restriction of filter characteristics by the Qs of resonators included in the acoustic wave filter device, it is difficult to improve filter characteristics. To address this problem, the inventor of preferred embodiments of the present invention has discovered that the change in the Qs at the resonant frequency and the anti-resonant frequency of a resonator depends on the aspect ratio of an IDT electrode in the resonator (i.e., an IDT electrode defining the resonator), which may be utilized to improve filter characteristics. This will be described hereinafter based on a specific typical example.

In a Typical Example 1 described below, frequency bands are different from those in the present preferred embodiment. However, the tendency for the Qs at the resonant FIG. 5 is a graph showing an impedance value Zmin. for the resonant frequency and an impedance value Zmax. for the anti-resonant frequency of the resonator in the Typical Example 1 with respect to the aspect ratio.

Figure 5:
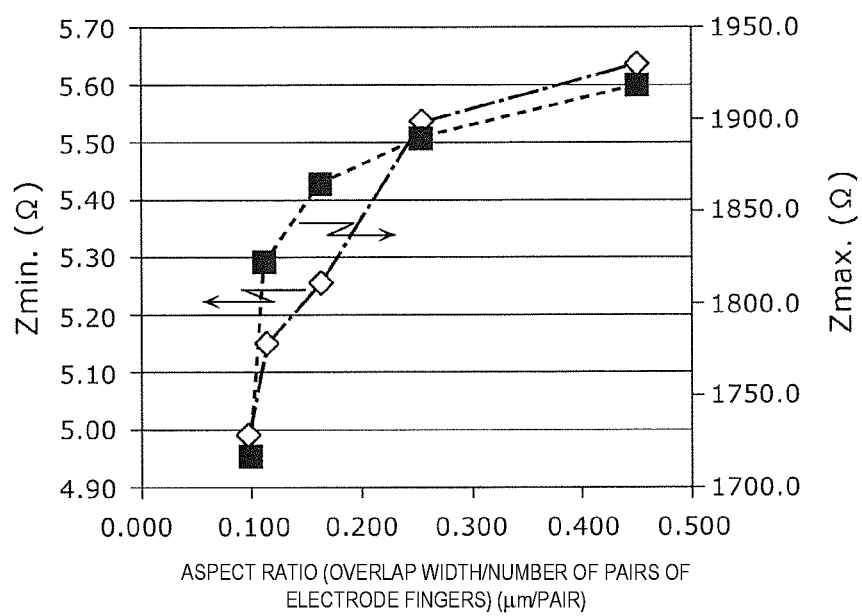
FIG. 5 is a graph depicting impedance values for the resonant frequency and anti-resonant frequency of the resonator in the Typical Example 1 with respect to the aspect ratio.

As illustrated in FIG. 5, both Zmin. and Zmax. are found to increase as the aspect ratio increases. That is, for the resonant frequency, the lower the aspect ratio, the higher the Q becomes, whereas, for the anti-resonant frequency, the higher the aspect ratio, the higher the Q becomes.

Accordingly, in the filter 10, decreasing the aspect ratio of the IDT electrode 131 in the parallel-arm resonator p2 and increasing the aspect ratio of the IDT electrode 121 in the parallel-arm resonator p1 achieves low loss within the pass band and improved sharpness on the high-frequency side of the pass band.

Figure 1C:
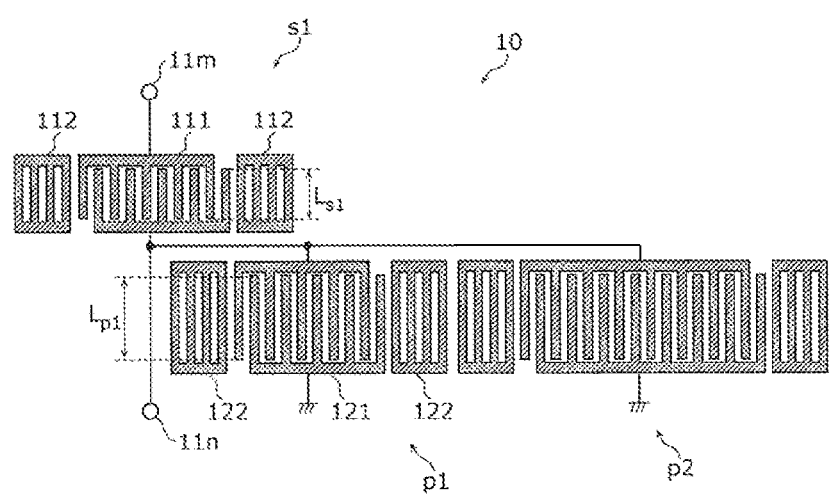
FIG. 1C is a schematic plan view of an electrode structure of the filter according to a modification of the Preferred Embodiment 1 of the present invention.

Additionally, the inventor of preferred embodiments of the present invention has discovered that ripples in the pass band are able to be reduced by increasing the number of pairs of electrode fingers of the IDT electrode 131 in the parallel-arm resonator p2, as shown in, for example, FIG. 1C. The aspect ratio is determined by two factors, namely, the overlap width and the number of pairs of electrode fingers. The inventor of preferred embodiments of the present invention has discovered that it is preferable to increase the number of pairs of electrode fingers among the two factors of the parallel-arm resonator p2 to a larger value to further reduce the aspect ratio. This will be described hereinafter based on a specific typical example. In a Typical Example 2 below, frequency bands are different from those in the present preferred embodiment. However, the tendency for ripples to change in dependence on the number of pairs of electrode fingers is similar to that in frequency bands in the present preferred embodiment. In the Typical Example 2 below, furthermore, as in the Typical Example 1 described above, different numbers of pairs of electrode fingers are provided, with the impedance of a resonator maintained constant (i.e., capacitance maintained constant). Thus, the overlap width is also adjusted in dependence on the number of pairs of electrode fingers.

Figure 6:
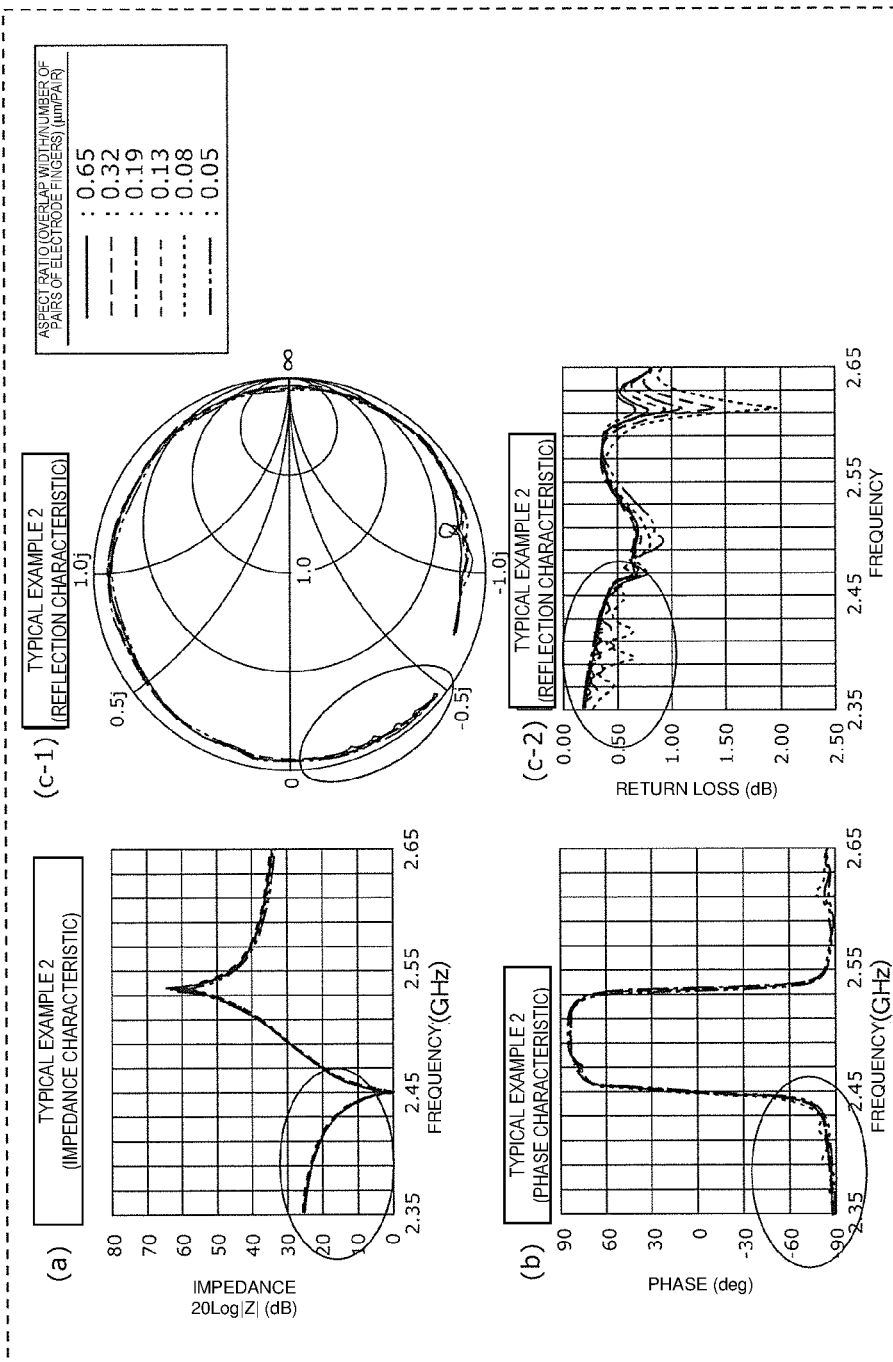
FIG. 6 illustrates graphs depicting characteristics when different numbers of pairs of electrode fingers are assigned to resonators in a Typical Example 2.

FIG. 6 illustrates graphs depicting characteristics when different numbers of pairs of electrode fingers are provided in resonators in the Typical Example 2. In FIG. 6, part (a) is a graph depicting impedance characteristics, part (b) is a graph depicting phase characteristics, part (c-1) is an impedance Smith chart illustrating reflection characteristics, and part (c-2) is a graph depicting the reflection characteristics (return loss). Specifically, in FIG. 6, impedance characteristics obtained when, as provided in the legends, the aspect ratio (overlap width/number of pairs of electrode fingers) is set to about 0.65, about 0.32, about 0.19, about 0.13, about 0.08, and about 0.05 (all expressed in μm/pair) are illustrated.

Table 2 shows the details of the design parameters of the resonator in this case. Although not shown in Table 2, the IDT wavelength λ and the film thickness h are the same or substantially the same in all the typical examples.

TABLE 2

| Aspect Ratio [μm/pair] | Overlap Width L [μm] | Overlap Width L [wavelength ratio] | Number of Pairs of Electrode Fingers [pair] |
|---|---|---|---|
| 0.65 (Typical Example 2-1) | 45.71 | 28.6 | 70 |
| 0.32 (Typical Example 2-2) | 32.00 | 20.0 | 100 |
| 0.19 (Typical Example 2-3) | 24.62 | 15.4 | 130 |
| 0.13 (Typical Example 2-4) | 20.00 | 12.5 | 160 |
| 0.08 (Typical Example 2-5) | 16.00 | 10.0 | 200 |
| 0.05 (Typical Example 2-6) | 12.80 | 8.0 | 250 |

As illustrated in parts (a) and (b) of FIG. 6, in a frequency band lower than the resonant frequency, the smaller the number of pairs of electrode fingers, the larger the ripples (local fluctuations) in the side lobes in the stop band caused by grating. This is because, as illustrated in parts (c-1) and (c-2) of FIG. 6, in this frequency band, the smaller the number of pairs of electrode fingers, the larger the ripples in reflection coefficient.

As illustrated in FIG. 3, the frequency band lower than the resonant frequency of the parallel-arm resonator p2 is located in the pass band of the filter 10. Accordingly, in terms of reducing ripples in the pass band of the filter 10, it is preferable to increase the number of pairs of electrode fingers of the IDT electrode 131 in the parallel-arm resonator p2 to decrease the aspect ratio.

Accordingly, as a result of intensive studies, the inventor of preferred embodiments of the present invention has discovered that the ripples are able to be reduced by increasing the number of pairs of electrode fingers.

That is, to reduce ripples in the pass band, the number of pairs of electrode fingers of the IDT electrode 131 is preferably larger than the number of pairs of electrode fingers of the IDT electrode 121. In other words, the parallel-arm resonator p2 preferably includes the IDT electrode 131 including a larger number of pairs of electrode fingers and therefore having a lower aspect ratio than that in the parallel-arm resonator p1. This configuration achieves low loss within the pass band and improved sharpness on the high-frequency side of the pass band while reducing ripples in the pass band.

The ripples are noticeable when, in particular, an IDT electrode is provided with reflectors in the acoustic wave propagation direction. That is, when a resonator including such reflectors as the parallel-arm resonator p2, an acoustic wave is reflected and confined to reduce the acoustic wave leakage to achieve high Q. However, this may cause ripples in the side lobes in the stop band caused by grating. The "grating" refers to a periodic repetitive structure of a plurality of electrode fingers included in a reflector. Accordingly, the parallel-arm resonator p2 including reflectors preferably includes more pairs of electrode fingers of an IDT electrode, thus achieving lower loss while reducing ripples in the pass band.

Next, advantageous effects achieved by the filter 10 according to the present preferred embodiment will be described with reference to an Example of a preferred embodiment of the present invention in comparison with a Comparative Example.

A filter of the Example has a configuration similar to that of the filter 10 according to the preferred embodiment described above. In contrast, a filter of the Comparative Example has substantially the same configuration as that of the filter of the Example, except that the parallel-arm resonator p1 and the parallel-arm resonator p2 include IDT electrodes having the same or substantially the same aspect ratio (overlap width/number of pairs of electrode fingers).

Table 3 shows a design parameter (aspect ratio) of the filters of the Example and the Comparative Example.

TABLE 3

| | Aspect Ratio [μm/pair] | | |
|---|---|---|---|
| | Series-Arm Resonator s1 | Parallel-Arm Resonator p1 | Parallel-Arm Resonators p2 |
| Example | 0.237 | 0.473 | 0.200 |
| Comparative Example | 0.237 | 0.313 | 0.313 |

As shown in Table 3, the series-arm resonator s1 of the Example includes an IDT electrode having the same aspect ratio as that in the series-arm resonator s1 of the Comparative Example.

The parallel-arm resonator p1 of the Example includes an IDT electrode having a higher aspect ratio than that in the parallel-arm resonator p1 of the Comparative Example. That is, in the Example, the parallel-arm resonator p1 includes an IDT electrode having a higher aspect ratio than that in the parallel-arm resonator p2. Further, in the Example, the parallel-arm resonator p1 includes an IDT electrode having a higher aspect ratio than that in the series-arm resonator s1.

The parallel-arm resonator p2 of the Example includes an IDT electrode having a lower aspect ratio than that in the parallel-arm resonator p2 of the Comparative Example. That is, in the Example, the parallel-arm resonator p2 includes an IDT electrode having a lower aspect ratio than that in the parallel-arm resonator p1. Further, in the Example, the parallel-arm resonator p2 includes an IDT electrode having a lower aspect ratio than that in the series-arm resonator s1.

Figure 7:
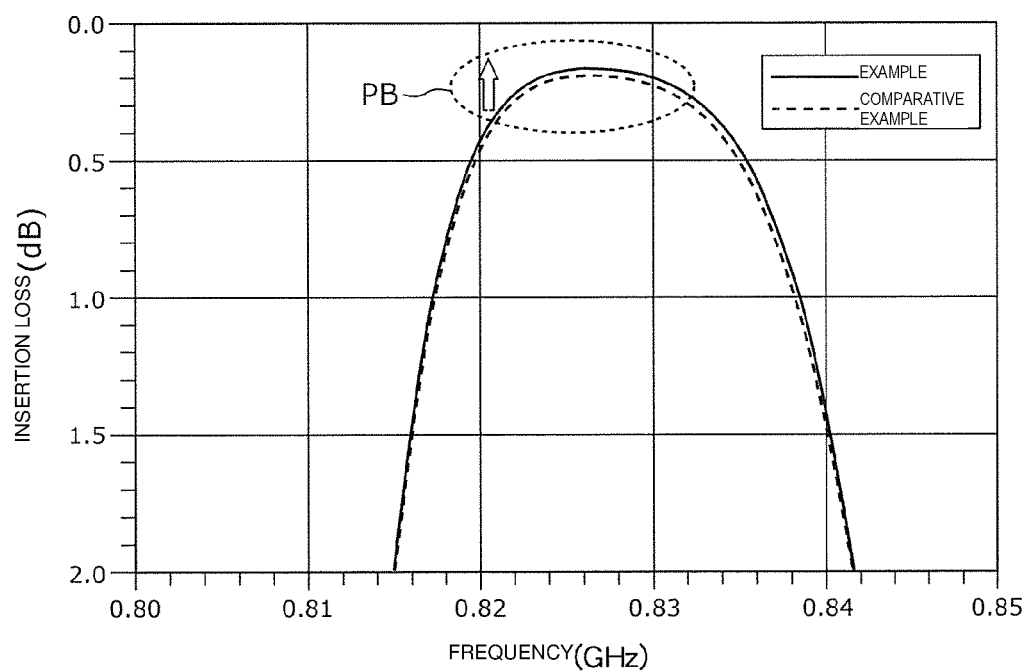
FIG. 7 is a graph depicting filter characteristics of filters of an Example and a Comparative Example.

FIG. 7 is a graph illustrating filter characteristics of the filters of the Example and the Comparative Example.

For the filter characteristics illustrated in FIG. 7, focusing on the pass band (portion PB in FIG. 7), it is discovered that the loss within the pass band is reduced in the Example, compared with the Comparative Example. That is, in the Example, lower loss within the pass band is achieved than in the Comparative Example.

For the filter characteristics illustrated in FIG. 7, furthermore, focusing on the attenuation slopes on the high-frequency side of the pass band, it is discovered that the steepness of the attenuation slope is improved in the Example, compared with the Comparative Example. That is, in the Example, the sharpness on the high-frequency side of the pass band is improved compared with the Comparative Example.

As described above, in the filter 10 (acoustic wave filter device) according to the present preferred embodiment, the parallel-arm resonator p2 (second parallel-arm resonator) includes the IDT electrode 131 having a higher frequency at which an acoustic wave is excited and having a lower aspect ratio than the parallel-arm resonator p1 (first parallel-arm resonator). As a result of intensive research, the inventor of preferred embodiments of the present invention made the following discoveries. For impedance characteristics of a resonator alone, the lower the aspect ratio of an IDT electrode, the higher the Q at the resonant frequency becomes. Conversely, the higher the aspect ratio of an IDT electrode, the higher the Q at the anti-resonant frequency becomes. For filter characteristics, as the Q at the resonant frequency of the parallel-arm resonator p2 and the Q at the anti-resonant frequency of the parallel-arm resonator p1 are increased, a lower loss within the pass band is able to be achieved and the sharpness on the high-frequency side of the pass band is able to be improved. Thus, setting the aspect ratio of the IDT electrode 131 in the parallel-arm resonator p2 to be lower than the aspect ratio of the IDT electrode 121 in the parallel-arm resonator p1 achieves low loss within the pass band and improved sharpness on the high-frequency side of the pass band.

In the filter 10 according to the present preferred embodiment, furthermore, the parallel-arm resonator p2 includes the IDT electrode 131 having a lower aspect ratio than that in the parallel-arm resonator p1.

In a resonator, the smaller the overlap width L (see FIG. 2), the smaller the electrode finger resistance. That is, reducing the overlap width reduces series resistance, which may deteriorate the Q at the resonant frequency of the resonator. Accordingly, reducing the overlap width $L_{p2}$ of the IDT electrode 131 in the parallel-arm resonator p2, that is, reducing the aspect ratio, achieves lower loss within the pass band and further improved sharpness on the high-frequency side of the pass band.

In the filter 10 according to the present preferred embodiment, furthermore, the series-arm resonator s1 includes the IDT electrode 111 having a lower aspect ratio than that in the parallel-arm resonator p1.

The pass band of the filter 10 is defined by the resonant frequency of the series-arm resonator s1 and the lower anti-resonant frequency of a parallel-arm resonant circuit (in the present preferred embodiment, a parallel-connected circuit of the parallel-arm resonators p1 and p2). As described above, for impedance characteristics of a resonator alone, the lower the aspect ratio of an IDT electrode, the higher the Q at the resonant frequency becomes. Conversely, the higher the aspect ratio of an IDT electrode, the higher the Q at the anti-resonant frequency becomes. Accordingly, a reduction in the aspect ratio of the IDT electrode 111 in the series-arm resonator s1 achieves lower loss within the pass band.

In the filter 10 according to the present preferred embodiment, furthermore, the series-arm resonator s1 includes the IDT electrode 111 having a higher aspect ratio than that in the parallel-arm resonator p2.

In a resonator (surface acoustic wave resonator) including an IDT electrode, if the overlap width L is set excessively small, it will lead to an increase in the effect of loss caused by the surface acoustic wave diffraction (diffraction loss). The resonant frequency of the series-arm resonator s1 defines the pass band, and the anti-resonant frequency of the series-arm resonator s1 defines the attenuation pole on the high-frequency side of the pass band. Accordingly, in terms of filter characteristics, there is a limit to the extent to which the overlap width $L_{s1}$ of the series-arm resonator s1 is able to be reduced. In contrast, the resonant frequency of the parallel-arm resonator p2 defines the attenuation pole on the high-frequency side of the pass band, whereas the anti-resonant frequency of the parallel-arm resonator p2 does not substantially contribute to the filter characteristics. In addition, diffraction loss occurs in a frequency range higher than the resonant frequency and is thus less likely to affect resonance characteristics. Accordingly, in terms of filter characteristics, there is no particular problem with a reduction in the overlap width $L_{p2}$ of the parallel-arm resonator p2.

Accordingly, setting the aspect ratio of the IDT electrode 111 of the series-arm resonator s1 to be higher than the aspect ratio of the IDT electrode 131 of the parallel-arm resonator p2 reduces or prevents the effect of diffraction loss caused by the overlap width $L_{s1}$ of the series-arm resonator s1 being excessively small. This achieves low loss within the pass band and improved sharpness on the high-frequency side of the pass band while reducing or preventing the deterioration in filter characteristics caused by diffraction loss.

In the preferred embodiment described above, the parallel-arm resonators p1 and p2 are connected in parallel and are connected to the same node x1 (node) on a series arm. However, the parallel-arm resonators p1 and p2 may be connected in series with each other and may be connected to the same node x1 (node) on a series arm. Accordingly, such a filter according to a modification of the Preferred Embodiment 1 will be described.

Figure 8A:
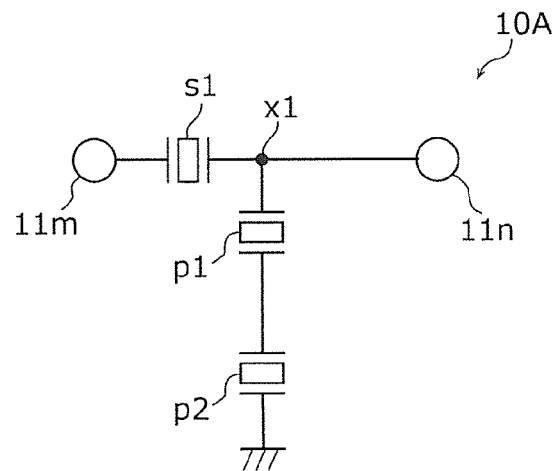
FIG. 8A is a circuit configuration diagram of a filter according to a modification of the Preferred Embodiment 1 of the present invention.
Figure 8B:
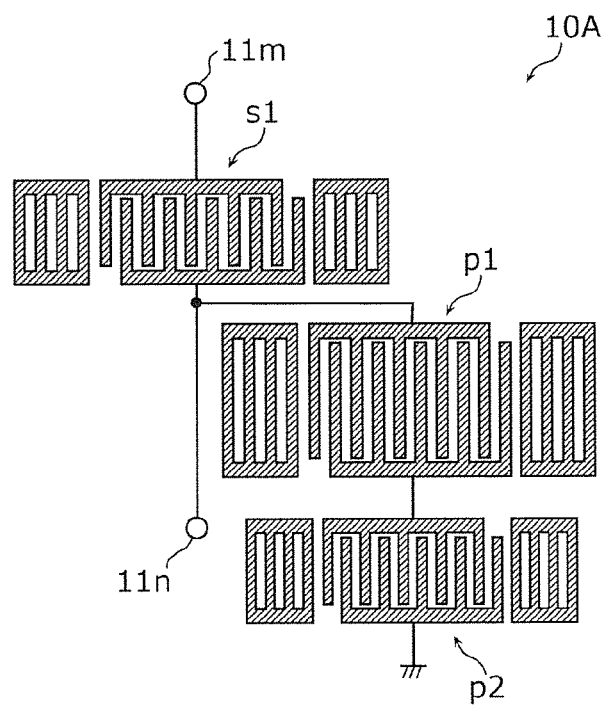
FIG. 8B is a schematic plan view of an electrode structure of the filter according to the modification of the Preferred Embodiment 1 of the present invention.

FIG. 8A is a circuit configuration diagram of a filter 10A according to the modification of the Preferred Embodiment 1. FIG. 8B is a schematic plan view of an electrode structure of the filter 10A according to the modification of the Preferred Embodiment 1.

In the filter 10A illustrated in FIGS. 8A and 8B, unlike the filter 10 illustrated in FIGS. 1A and 1B, the parallel-arm resonators p1 and p2 are connected between ground and the same node x1 on a path connecting the input/output terminal 11m (first input/output terminal) and the input/output terminal 11n (second input/output terminal) so as to be connected in series with each other. In the present modification, the parallel-arm resonator p1 includes a terminal connected to the node x1 and another terminal connected to one terminal of the parallel-arm resonator p2. The parallel-arm resonator p2 includes a terminal connected to the other terminal of the parallel-arm resonator p1 and another terminal connected to ground. The order in which the parallel-arm resonators p1 and p2 are connected is not limited to that described above and may be reverse.

Figure 9:
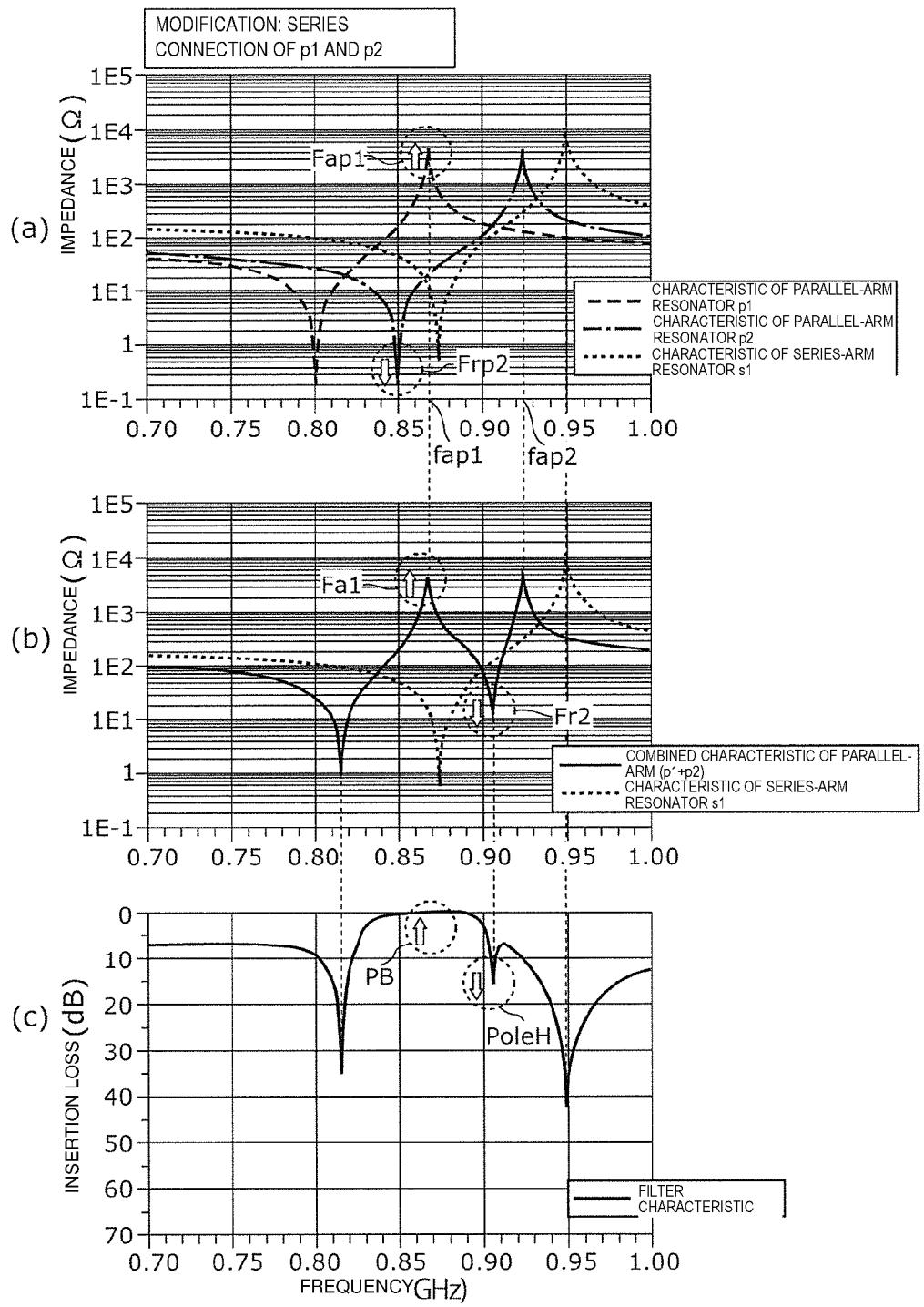
FIG. 9 illustrates graphs depicting characteristics of the filter according to the modification of the Preferred Embodiment 1 of the present invention.

FIG. 9 illustrates graphs depicting characteristics of the filter 10A according to the modification of Preferred Embodiment 1.

Also for the characteristics of the filter 10A according to the present modification, as for the characteristics of the filter 10 according to the Preferred Embodiment 1, the Q at the anti-resonant frequency (Fap1 in FIG. 9) of the parallel-arm resonator p1 and the Q at the resonant frequency (Frp2 in FIG. 9) of the parallel-arm resonator p2 affect the sharpness on the high-frequency side of the pass band. A specific mechanism for this is similar to that in the Preferred Embodiment 1 and thus will not be described in detail herein.

Further, also for the filter 10A according to the present modification, near the lower anti-resonant frequency, the combined impedance characteristic of a parallel-arm circuit corresponds to a characteristic obtained by combining the capacitance component of the parallel-arm resonator p2 with the characteristic of the parallel-arm resonator p1. Accordingly, in addition to increasing the Q at the anti-resonant frequency of the parallel-arm resonator p1, increasing the Q of the capacitance component of the parallel-arm resonator p2, that is, reducing the series resistance of the parallel-arm resonator p2, reduces the loss within the pass band of the filter 10A.

Accordingly, even with the filter 10A according to the present modification, in which the parallel-arm resonator p2 includes an IDT electrode having a lower aspect ratio than that in the parallel-arm resonator p1, as in the Preferred Embodiment 1, low loss and improved sharpness on the high-frequency side of the pass band are able to be achieved.

Preferred Embodiment 2

The configurations of the filters (acoustic wave filter devices) according to the Preferred Embodiment 1 and its modification are applicable to a tunable filter having a variable pass band. Accordingly, such a tunable filter according to a Preferred Embodiment 2 of the present invention will be described with reference to Application Examples 1 to 5. Specifically, Application Examples 1 to 4 are application examples of the filter 10 according to Preferred Embodiment 1 to a tunable filter, and Application Example 5 is an application example of the filter 10A according to the modification of the Preferred Embodiment 1 to a tunable filter.

The tunable filters in Application Examples 1 to 5 described below each include a switch element connected in series with or parallel to the parallel-arm resonator p1 or the parallel-arm resonator p2, and each have a pass band switched in accordance with the connection (ON) or disconnection (OFF) of the switch element. The switch element is turned on or off in accordance with a control signal from a controller, such as an RF signal processing circuit (RFIC: Radio Frequency Integrated Circuit), for example.

Application Example 1

Figure 10A:
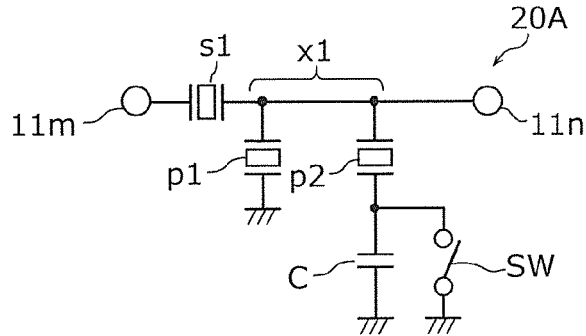
FIG. 10A is a circuit configuration diagram of a filter in an Application Example 1 of a Preferred Embodiment 2 of the present invention.

FIG. 10A is a circuit configuration diagram of a filter 20A in an Application Example 1 of the Preferred Embodiment 2.

Unlike the filter 10 illustrated in FIG. 1A, the filter 20A illustrated in FIG. 10A further includes a capacitor C and a switch SW that are connected in parallel and that are connected in series with at least one of the parallel-arm resonators p1 and p2 (first parallel-arm resonator and second parallel-arm resonator) (in the present application example, the parallel-arm resonator p2). This configuration enables the filter 20A to switch between a first pass band and a second pass band in accordance with the connection or disconnection of the switch SW. Specifically, in the present application example, the capacitor C and the switch SW, which are connected in parallel, are connected in series with only the parallel-arm resonator p2 out of the parallel-arm resonators p1 and p2.

In other words, unlike the filter 10, the filter 20A further includes an impedance circuit in which the capacitor C and the switch SW are connected in parallel. Further, at least one of the parallel-arm resonators p1 and p2 is connected in series with the impedance circuit. Specifically, in the present application example, the parallel-arm resonator p2 (second parallel-arm resonator) is connected in series with the impedance circuit, and the parallel-arm resonator p1 (first parallel-arm resonator) is connected in parallel to a circuit in which the parallel-arm resonator p2 and the impedance circuit are connected in series.

That is, in the present application example, a circuit in which the capacitor C and the switch SW are connected in parallel is connected in series with the parallel-arm resonator p2 between the node x1 and ground, and, specifically, is connected in series between ground and the parallel-arm resonator p2. The capacitor C and the switch SW may be connected between the node x1 and the parallel-arm resonator p2.

In the present preferred embodiment, the capacitor C is an impedance element connected in series with the parallel-arm resonator p2. The frequency variable width of the pass band of the filter 20A depends on the constant of the capacitor C. For example, the frequency variable width increases as the constant of the capacitor C decreases. Thus, the constant of the capacitor C may be determined, as desired, in accordance with the frequency specifications required for the filter 20A. Further, the capacitor C may be a variable capacitor, such as a varicap or a DTC (Digital Tunable Capacitor), for example. Accordingly, the frequency variable width is able to be finely adjusted.

The switch SW is preferably, for example, an SPST (Single Pole Single Throw) switch element including a terminal connected to a connection node between the parallel-arm resonator p2 and the capacitor C and another terminal connected to ground. The switch SW is switched between connection (ON) and disconnection (OFF) in accordance with a control signal from a control unit (not illustrated), thus establishing connection or disconnection between the connection node and ground.

Preferred examples of the switch SW include a GaAs or CMOS (Complementary Metal Oxide Semiconductor) FET (Field Effect Transistor) switch and a diode switch. Accordingly, the switch SW may be a single FET switch or diode switch, and thus the filter 20A is able to be reduced in size.

The parallel-arm resonators p1 and p2, the capacitor C, and the switch SW define a parallel-arm resonant circuit connected between ground and the node x1 on the path connecting the input/output terminal 11m and the input/output terminal 11n. That is, the parallel-arm resonant circuit is disposed in a single path connecting the path and ground.

Thus, the filter 20A has a single-stage ladder filter structure including the series-arm resonator s1 and the parallel-arm resonant circuit.

In the parallel-arm resonant circuit, the resonant frequency and the anti-resonant frequency are both switched to lower ranges or higher ranges in accordance with switching between ON (connection) or OFF (disconnection) of the switch SW. This will be described below together with the characteristics of the filter 20A.

Figure 10B:
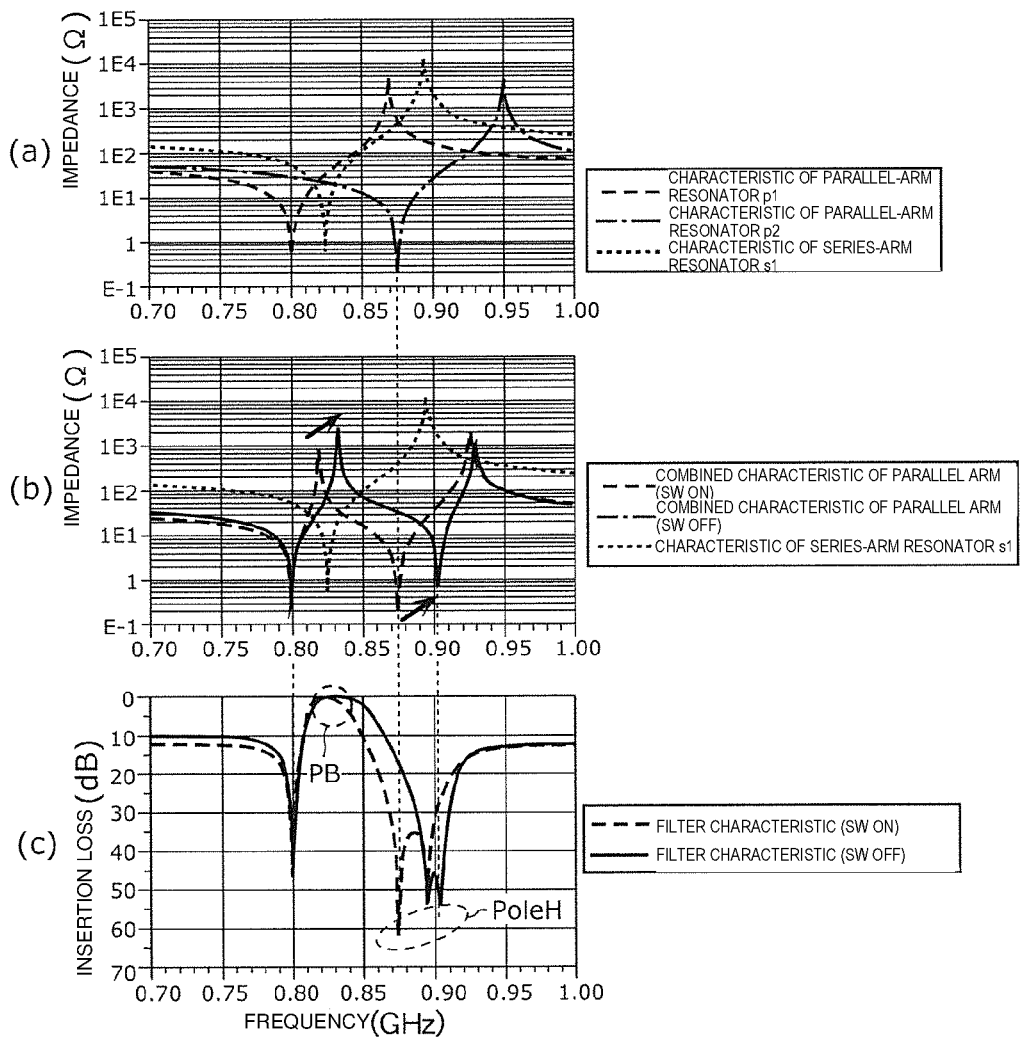
FIG. 10B illustrates graphs depicting characteristics of the filter in the Application Example 1 of the Preferred Embodiment 2 of the present invention.

FIG. 10B illustrates graphs depicting characteristics of the filter 20A in the Application Example 1 of the Preferred Embodiment 2. Specifically, part (a) of FIG. 10B is a graph depicting the impedance characteristics of resonators alone (the parallel-arm resonators p1 and p2 and the series-arm resonator s1). Part (b) of FIG. 10B is a graph depicting a comparison of the combined impedance characteristics (combined characteristics) of a parallel-arm resonant circuit (in the present application example, a circuit including the parallel-arm resonators p1 and p2, the capacitor C, and the switch SW) when the switch SW is on and when the switch SW is off. In FIG. 10B, the impedance characteristic of the series-arm resonator s1 is also illustrated. Part (c) of FIG. 10B is a graph depicting a comparison of filter characteristics when the switch SW is on and when the switch SW is off.

The impedance characteristics of resonators (the parallel-arm resonator p1, the parallel-arm resonator p2, and the series-arm resonator s1) alone and the characteristic when the switch SW is on are similar to those in Preferred Embodiment 1 described above. Thus, these will be described in a simplified manner, as appropriate, hereinafter.

That is, when the switch SW is on, the filter 20A has a first bandpass characteristic in which a pass band is defined by the lower anti-resonant frequency among the two anti-resonant frequencies of the parallel-arm resonant circuit and by the resonant frequency frs1 of the series-arm resonator s1, a pole (attenuation pole) on the low-frequency side of the pass band is defined by the resonant frequency frp1 of the parallel-arm resonator p1, and a pole (attenuation pole) on the high-frequency side of the pass band is defined by the resonant frequency frp2 of the parallel-arm resonator p2 and the anti-resonant frequency fas1 of the series-arm resonator s1.

When the switch SW is off, on the other hand, the impedance characteristic of the parallel-arm resonant circuit is affected by the capacitor C. That is, in this case, the combined characteristic of the two parallel-arm resonators (the parallel-arm resonators p1 and p2) and the capacitor C corresponds to the impedance characteristic of the parallel-arm resonant circuit.

In the present application example, the capacitor C is added only to the parallel-arm resonator p2 when the switch SW is off. Thus, as indicated by solid black arrows in part (b) of FIG. 10B, when the switch SW is switched from on to off, in the impedance characteristic of the parallel-arm resonant circuit ("combined characteristic of parallel arm" in FIG. 10B), the higher resonant frequency of the two resonant frequencies and the lower anti-resonant frequency out of the two anti-resonant frequencies are both switched to higher ranges.

The lower anti-resonant frequency and the higher resonant frequency of the parallel-arm resonant circuit define an attenuation slope on the high-frequency side of the pass band of the filter 20A. Accordingly, as illustrated in part (c) of FIG. 10B, the switch SW is switched from on to off, thus switching the bandpass characteristic of the filter 20A from a first characteristic to a second characteristic in which the attenuation slope on the high-frequency side of the pass band is shifted to a higher range with the steepness maintained. In other words, the filter 20A is able to switch between the first characteristic and the second characteristic with a reduced or prevented increase in insertion loss at the high-frequency end of the pass band while switching the attenuation pole frequency on the high-frequency side of the pass band in accordance with switching between the connection and disconnection of the switch SW.

Even with the filter 20A having the configuration described above, in which the parallel-arm resonator p2 includes an IDT electrode having a lower aspect ratio than that in the parallel-arm resonator p1, as in the Preferred Embodiment 1, for each of the first bandpass characteristic and the second bandpass characteristic, low loss and improved sharpness on the high-frequency side of the pass band is able to be achieved. That is, the filter 20A defines a tunable filter that is able to achieve low loss and improved sharpness on the high-frequency side of the pass band.

The impedance element is not limited to a capacitor and may be an inductor, for example. When an inductor is used as an impedance element, the direction in which an attenuation slope is shifted in response to the switching of the on and off of the switch SW is different than that in the configuration described above. Specifically, in the second bandpass characteristic when the switch SW is off, an attenuation slope is shifted to a lower range, compared with the first bandpass characteristic when the switch SW is on. At this time, the frequency variable width of the pass band of the filter 20A depends on the constant of the inductor. For example, the frequency variable width increases as the constant of the inductor increases. Thus, the constant of the inductor may be determined, as desired, in accordance with the frequency specifications required for the filter 20A. In this case, the inductor may preferably be, for example, a MEMS (Micro Electro Mechanical Systems) variable inductor. Accordingly, the frequency variable width is able to be finely adjusted.

Application Example 2

Figure 11A:
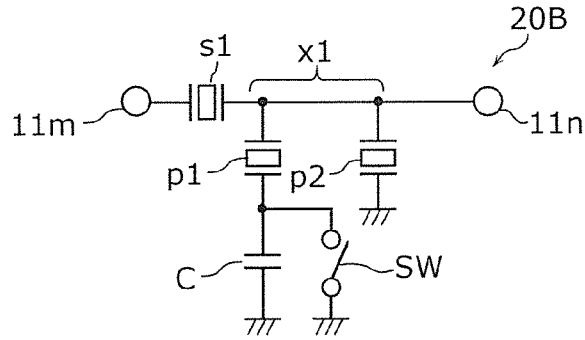
FIG. 11A is a circuit configuration diagram of a filter in and Application Example 2 of the Preferred Embodiment 2 of the present invention.

FIG. 11A is a circuit configuration diagram of a filter 20B in an Application Example 2 of the Preferred Embodiment 2.

In the filter 20B illustrated in FIG. 11A, unlike the filter 20A illustrated in FIG. 10A, the capacitor C and the switch SW, which are connected in parallel, are connected in series with only the parallel-arm resonator p1 out of the parallel-arm resonators p1 and p2.

In other words, in the filter 20A, the parallel-arm resonator p2 is connected in series with an impedance circuit including the capacitor C and the switch SW connected in parallel. In the filter 20B, in contrast, the parallel-arm resonator p1 (first parallel-arm resonator) is connected in series with the impedance circuit, and the parallel-arm resonator p2 (second parallel-arm resonator) is connected in parallel to a circuit in which the parallel-arm resonator p1 and the impedance circuit are connected in series.

Figure 11B:
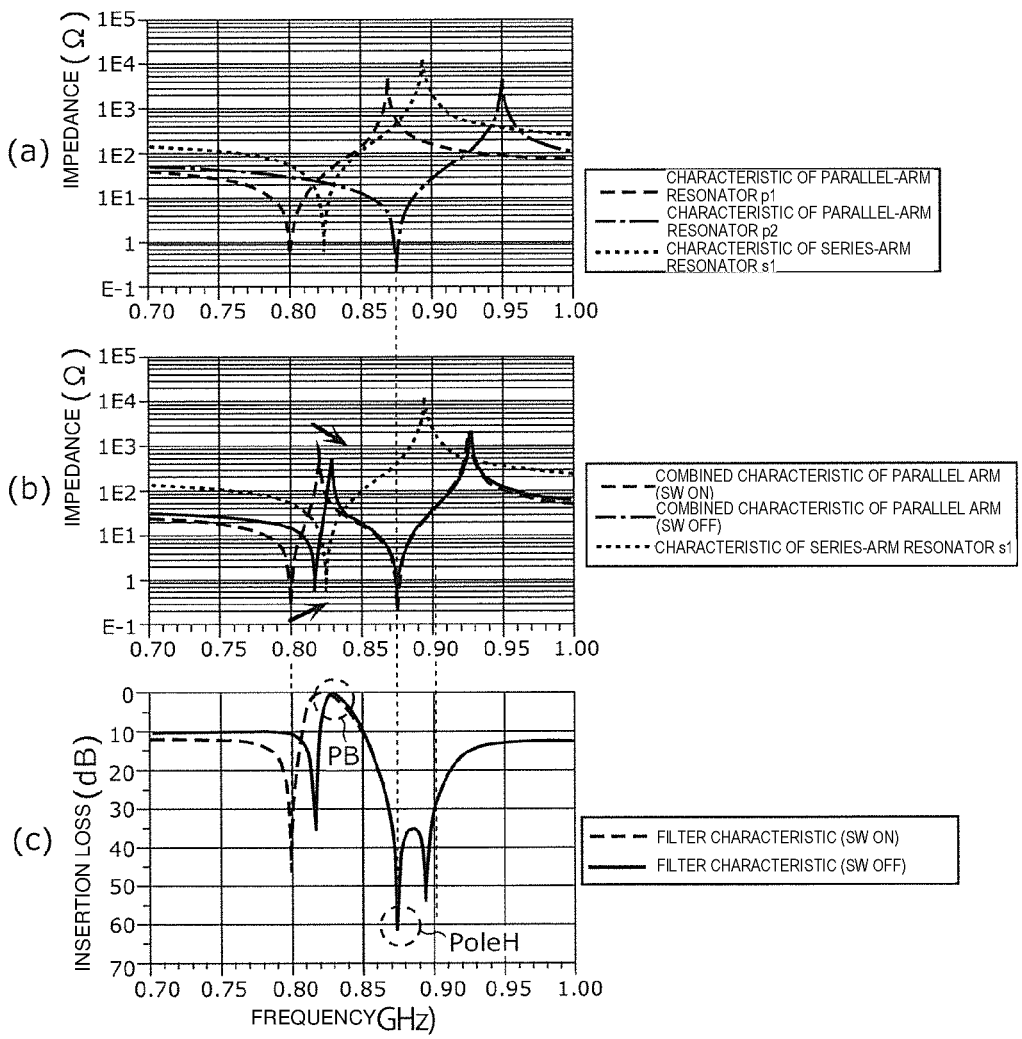
FIG. 11B illustrates graphs depicting characteristics of the filter in the Application Example 2 of the Preferred Embodiment 2 of the present invention.

FIG. 11B illustrates graphs depicting characteristics of the filter 20B in the Application Example 2 of the Preferred Embodiment 2. Specifically, as in parts (a) and (b) of FIG. 10B, parts (a) and (b) of FIG. 11B are graphs depicting the impedance characteristics of resonators alone and combined impedance characteristics of a parallel-arm resonant circuit. Part (c) of FIG. 11B is a graph depicting a comparison of filter characteristics when the switch SW is on and when the switch SW is off.

In the present application example, the capacitor C is added only to the parallel-arm resonator p1 when the switch SW is off. Thus, as indicated by solid black arrows in part (b) of FIG. 11B, when the switch SW is switched from on to off, in the impedance characteristic of the parallel-arm resonant circuit ("combined characteristic of parallel arm" in FIG. 11B), the lower resonant frequency out of the two resonant frequencies and the lower anti-resonant frequency out of the two anti-resonant frequencies are both shifted to higher ranges.

The lower anti-resonant frequency and the lower resonant frequency of the parallel-arm resonant circuit define an attenuation slope on the low-frequency side of the pass band of the filter 20B. Accordingly, as illustrated in part (c) of FIG. 11B, the switch SW is switched from on to off, thus switching the bandpass characteristic of the filter 20B from the first bandpass characteristic to a second bandpass characteristic in which the attenuation slope on the low-frequency side of the pass band is shifted to a higher range with the steepness maintained. In other words, the filter 20B is able to switch the attenuation pole on the low-frequency side of the pass band in accordance with switching between the connection and disconnection of the switch SW, and is able to reduce or prevent the increase in insertion loss at the low-frequency end of the pass band.

Even with the filter 20B having the configuration described above, in which the parallel-arm resonator p2 includes an IDT electrode having a lower aspect ratio than that in the parallel-arm resonator p1, as in the Preferred Embodiment 1, for each of the first bandpass characteristic and the second bandpass characteristic, low loss and improved sharpness on the high-frequency side of the pass band are able to be achieved. That is, the filter 20B defines a tunable filter that is able to achieve low loss and improved sharpness on the high-frequency side of the pass band.

Application Example 3

Figure 12A:
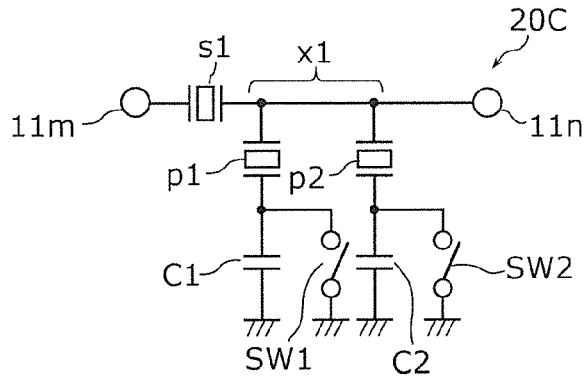
FIG. 12A is a circuit configuration diagram of a filter in an Application Example 3 of the Preferred Embodiment 2 of the present invention.

FIG. 12A is a circuit configuration diagram of a filter 20C in an Application Example 3 of the Preferred Embodiment 2.

In the filter 20C illustrated in FIG. 12A, the attenuation slopes on the high-frequency side of the pass band and the low-frequency side of the pass band are both shifted. Specifically, the filter 20C includes a capacitor C1 and a switch SW1, which correspond to the capacitor C (impedance element) and the switch SW in the pair included in the filter 20B illustrated in FIG. 11A. The filter 20C further includes a capacitor C2 and a switch SW2, which correspond to the capacitor C (impedance element) and the switch SW in the pair included in the filter 20A illustrated in FIG. 10A.

In other words, the filters 20A and 20B include a single impedance circuit including the capacitor C and the switch SW connected in parallel. In contrast, the filter 20C includes two impedance circuits. In addition, the parallel-arm resonator p1 (first parallel-arm resonator) is connected in series with one impedance circuit among the two impedance circuits. The parallel-arm resonator p2 (second parallel-arm resonator) is connected in series with the other impedance circuit among the two impedance circuits. Additionally, a circuit in which the parallel-arm resonator p1 and the one impedance circuit are connected in series and a circuit in which the parallel-arm resonator p2 and the other impedance circuit are connected in series are connected in parallel.

Figure 12B:
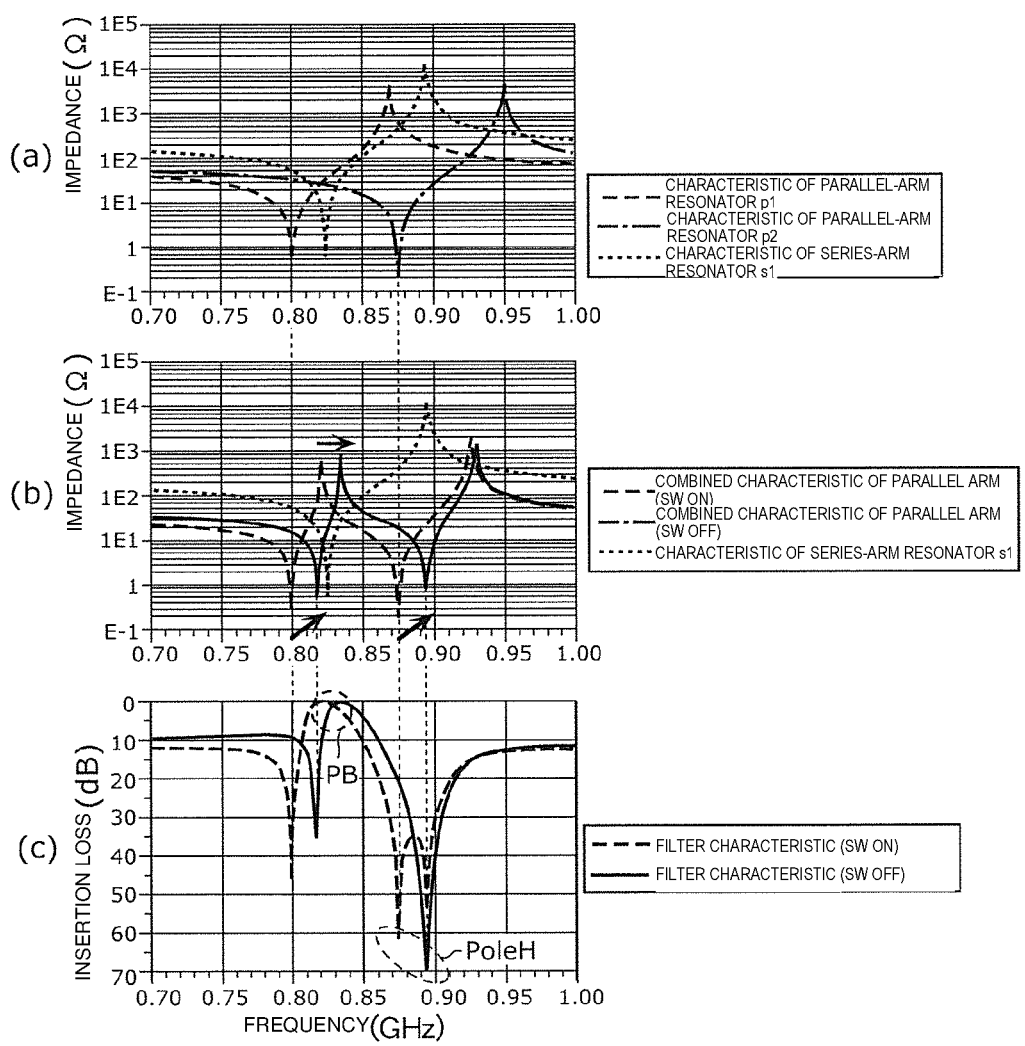
FIG. 12B illustrates graphs depicting characteristics of the filter in the Application Example 3 of the Preferred Embodiment 2 of the present invention.

FIG. 12B illustrates graphs depicting characteristics of the filter 20C in the Application Example 3 of the Preferred Embodiment 2. Specifically, as in parts (a) and (b) of FIG. 10B, parts (a) and (b) of FIG. 12B are graphs depicting the impedance characteristics of resonators alone and combined impedance characteristics of a parallel-arm resonant circuit (in the present application example, a circuit including the parallel-arm resonators p1 and p2, the capacitors C1 and C2, and the switches SW1 and SW2). Part (c) of FIG. 12B is a graph depicting a comparison of filter characteristics when both the switches SW1 and SW2 are on or off.

In the present application example, during the off period of both of the switches SW1 and SW2, the capacitor C1 is added to the parallel-arm resonator p1 and the capacitor C2 is added to the parallel-arm resonator p2. Thus, as indicated by solid black arrows in part (b) of FIG. 12B, when the switches SW1 and SW2 are both switched from on to off, in the impedance characteristic of the parallel-arm resonant circuit ("combined characteristic of parallel arm" in FIG. 12B), both of the two resonant frequencies and the lower anti-resonant frequency out of the two anti-resonant frequencies are shifted to higher ranges.

Accordingly, as illustrated in part (c) of FIG. 12B, the switches SW1 and SW2 are both switched from on to off, thus switching the bandpass characteristic of the filter 20C from the first bandpass characteristic to a second bandpass characteristic in which the attenuation slopes on the high-frequency side of the pass band and the low-frequency side of the pass band are shifted to higher ranges with their steepness maintained. In other words, the filter 20C is able to switch the attenuation pole frequencies on the high-frequency side of the pass band and the low-frequency side of the pass band in accordance with switching between the connection and disconnection of the switches SW1 and SW2, and are able to reduced or prevent the increase in insertion loss at the high-frequency end of the pass band and at the low-frequency end of the pass band. Thus, for example, the filter 20C is able to switch the center frequency while maintaining the band width.

Even with the filter 20C having the configuration described above, in which the parallel-arm resonator p2 includes an IDT electrode having a lower aspect ratio than that in the parallel-arm resonator p1, as in the Preferred Embodiment 1, for each of the first bandpass characteristic and the second bandpass characteristic, low loss and improved sharpness on the high-frequency side of the pass band are able to be achieved. That is, the filter 20C defines a tunable filter that is able to achieve low loss and improved sharpness on the high-frequency side of the pass band.

In the filter 20C, the on and off of the switches SW1 and SW2 may not be switched together, but may be switched separately. However, switching the on and off the switches SW1 and SW2 together reduces the number of control lines to control the switches SW1 and SW2, achieving a simplified configuration of the filter 20C.

In contrast, switching the on and off of the switches SW1 and SW2 separately provides more variations in the pass band that may be switched by the filter 20C.

Specifically, as described for the filter 20A, the high-frequency end of the pass band is able to be varied in accordance with the on and off of the switch SW2 connected in series with the parallel-arm resonator p2. Further, as described for the filter 20B, the low-frequency end of the pass band is able to be varied in accordance with the on and off of the switch SW1 connected in series with the parallel-arm resonator p1.

Thus, turning on or off both of the switches SW1 and SW2 shifts the low-frequency end and the high-frequency end of the pass band to lower ranges or higher ranges. That is, the center frequency of the pass band is able to be shifted to a lower range or a higher range. In addition, switching one of the switches SW1 and SW2 from on to off and the other switch from off to on shifts both of the low-frequency end and the high-frequency end of the pass band so as to increase or reduce the frequency difference. That is, the width of the pass band is able to be varied with the center frequency of the pass band maintained constant or substantially constant. Additionally, when one of the switches SW1 and SW2 is in the on or off state, turning on and off the other switch shifts, with one of the low-frequency end and the high-frequency end of the pass band fixed, the other frequency end to a lower range or a higher range. That is, the low-frequency end or the high-frequency end of the pass band is able to be changed.

Accordingly, the use of the capacitors C1 and C2 and the switches SW1 and SW2 improves the flexibility of changing the pass band.

Application Example 4

Figure 13A:
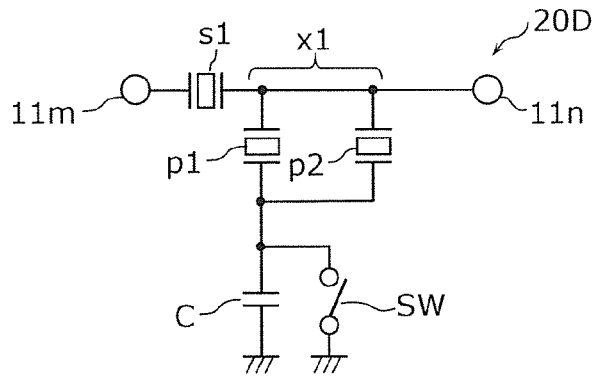
FIG. 13A is a circuit configuration diagram of a filter in an Application Example 4 of the Preferred Embodiment 2 of the present invention.

FIG. 13A is a circuit configuration diagram of a filter 20D in an Application Example 4 of the Preferred Embodiment 2.

In the filter 20D illustrated in FIG. 13A, unlike the filter 20A illustrated in FIG. 10A, the capacitor C and the switch SW, which are connected in parallel, are connected in series with a circuit in which the parallel-arm resonator p1 and the parallel-arm resonator p2 are connected in parallel.

In other words, in the filter 20D, the parallel-arm resonator p1 (first parallel-arm resonator) and the parallel-arm resonator p2 (second parallel-arm resonator) are connected in parallel. In addition, an impedance circuit including the capacitor C and the switch SW connected in parallel is connected in series with a circuit in which the parallel-arm resonator p1 and the parallel-arm resonator p2 are connected in parallel.

Figure 13B:
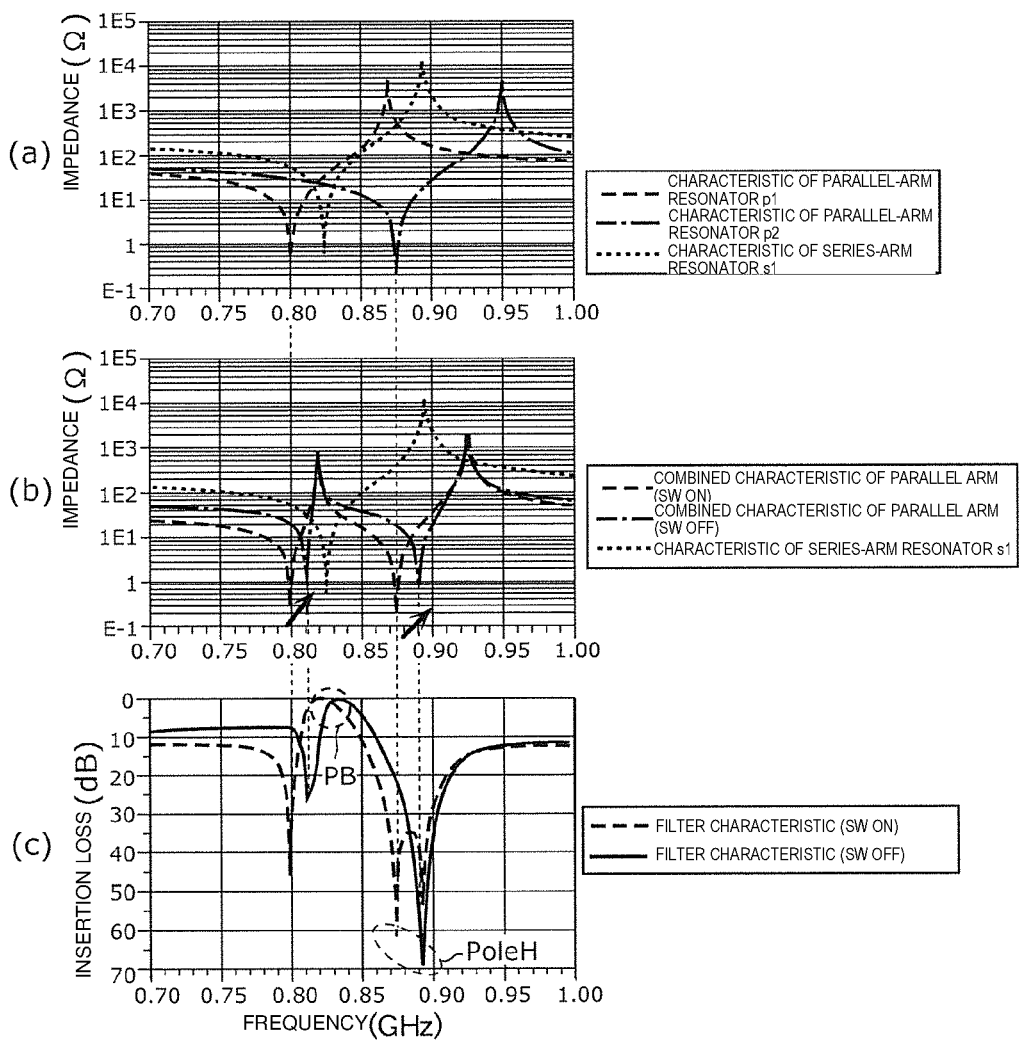
FIG. 13B illustrates graphs depicting characteristics of the filter in the Application Example 4 of the Preferred Embodiment 2 of the present invention.

FIG. 13B illustrates graphs depicting characteristics of the filter 20D in the Application Example 4 of the Preferred Embodiment 2. Specifically, as in parts (a) and (b) of FIG. 10B, parts (a) and (b) of FIG. 13B are graphs depicting the impedance characteristics of resonators alone and combined impedance characteristics of a parallel-arm resonant circuit. Part (c) of FIG. 13B is a graph depicting a comparison of filter characteristics when the switch SW is on and when the switch SW is off.

In the present application example, when the switch SW is off, the capacitor C is added to the parallel-arm resonators p1 and p2, which are connected in parallel. Thus, as indicated by solid black arrows in part (b) of FIG. 13B, when the switch SW is switched from on to off, in the impedance characteristic of the parallel-arm resonant circuit ("combined characteristic of parallel arm" in FIG. 13B), neither of the two anti-resonant frequencies is shifted, whereas both of the two resonant frequencies are shifted to higher ranges.

Accordingly, as illustrated in part (c) of FIG. 13B, the switch SW is switched from on to off, thus switching the bandpass characteristic of the filter 20D from the first bandpass characteristic to a second bandpass characteristic in which both of the poles (attenuation poles) on both sides of the pass band are shifted to higher ranges.

Even with the filter 20D having the configuration described above, in which the parallel-arm resonator p2 includes an IDT electrode having a lower aspect ratio than that in the parallel-arm resonator p1, as in Preferred Embodiment 1, for each of the first bandpass characteristic and the second bandpass characteristic, low loss and improved sharpness on the high-frequency side of the pass band are able to be achieved. That is, the filter 20D defines a tunable filter that is able to achieve low loss and improved sharpness on the high-frequency side of the pass band.

Application Example 5

Figure 14A:
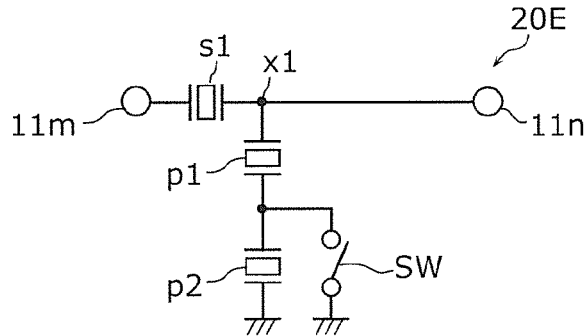
FIG. 14A is a circuit configuration diagram of a filter in an Application Example 5 of the Preferred Embodiment 2 of the present invention.

FIG. 14A is a circuit configuration diagram of a filter 20E in an Application Example 5 of the Preferred Embodiment 2.

Unlike the filter 10A illustrated in FIG. 8A, the filter 20E illustrated in FIG. 14A further includes a switch SW connected in parallel to one parallel-arm resonator among the parallel-arm resonators p1 and p2 (first parallel-arm resonator and second parallel-arm resonator). In addition, the other parallel-arm resonator among the parallel-arm resonators p1 and p2 is connected in series with a circuit in which the one parallel-arm resonator and the switch SW are connected in parallel.

In the present application example, the switch SW is connected in parallel to the parallel-arm resonator p2. If the specifications required the filter 20E to permit, for example, the effect of the diffraction loss of the parallel-arm resonator p2, the switch SW may be connected in parallel to the parallel-arm resonator p1.

Figure 14B:
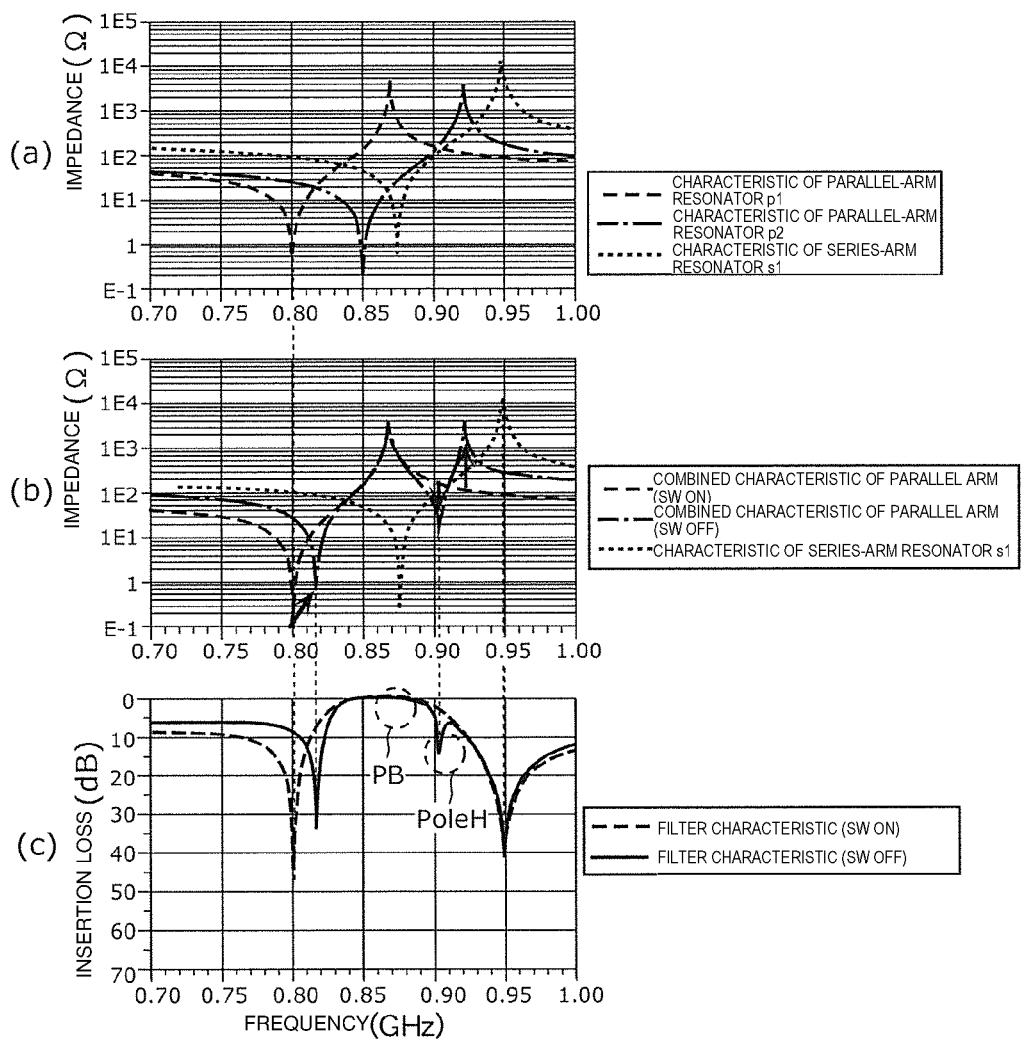
FIG. 14B illustrates graphs depicting characteristics of the filter in the Application Example 5 of the Preferred Embodiment 2 of the present invention.

FIG. 14B illustrates graphs depicting characteristics of the filter 20E in the Application Example 5 of the Preferred Embodiment 2. Specifically, as in parts (a) and (b) of FIG. 10B, parts (a) and (b) of FIG. 14B are graphs depicting the impedance characteristics of resonators alone and combined impedance characteristics of a parallel-arm resonant circuit (in the present application example, a circuit including the parallel-arm resonators p1 and p2 and the switch SW). Part (c) of FIG. 14B is a graph depicting a comparison of filter characteristics when the switch SW is on and when the switch SW is off.

In the present application example, when the switch SW is on, the impedance characteristic of the parallel-arm resonant circuit ("combined characteristic of parallel arm" in FIG. 14B) corresponds to the impedance characteristic of the parallel-arm resonator p1 alone. When the switch SW is off, on the other hand, the parallel-arm resonator p2 is added to the parallel-arm resonator p1. Thus, as indicated by solid black arrows in part (b) of FIG. 14B, when the switch SW is switched from on to off, the impedance characteristic of the parallel-arm resonant circuit ("combined characteristic of parallel arm" in FIG. 14B) corresponds to the combined impedance characteristic of a series-connected circuit of the parallel-arm resonators p1 and p2.

Accordingly, as illustrated in part (c) of FIG. 14B, the switch SW is switched from on to off, thus shifting, in the bandpass characteristic of the filter 20E, the attenuation pole on the low-frequency side of the pass band to a higher range. Additionally, an additional attenuation pole is generated on the high-frequency side of the pass band (indicated by PoleH in part (c) of FIG. 14B). Thus, attenuation on the high-frequency side of the pass band is also able to be obtained. In other words, the filter 20E is able to switch the attenuation pole frequency on the low-frequency side of the pass band in accordance with switching between the on and off of the switch SW, and is able to switch the number of attenuation poles on the high-frequency side of the pass band.

Even with the filter 20E having the configuration described above, in which the parallel-arm resonator p2 includes an IDT electrode having a lower aspect ratio than that in the parallel-arm resonator p1, for a characteristic obtained by adding the parallel-arm resonator p2 to the parallel-arm resonator p1, as in the Preferred Embodiment 1, low loss and improved sharpness on the high-frequency side of the pass band are able to be achieved. That is, the filter 20E defines a tunable filter that is able to achieve low loss and improved sharpness on the high-frequency side of the pass band.

Preferred Embodiment 3

The filters (acoustic wave filter devices) provided in Preferred Embodiments 1 and 2 described above and their modification are applicable to a multiplexer, a radio-frequency front-end circuit, and other suitable devices.

In the present preferred embodiment, a radio-frequency front-end circuit will be described.

Figure 15:
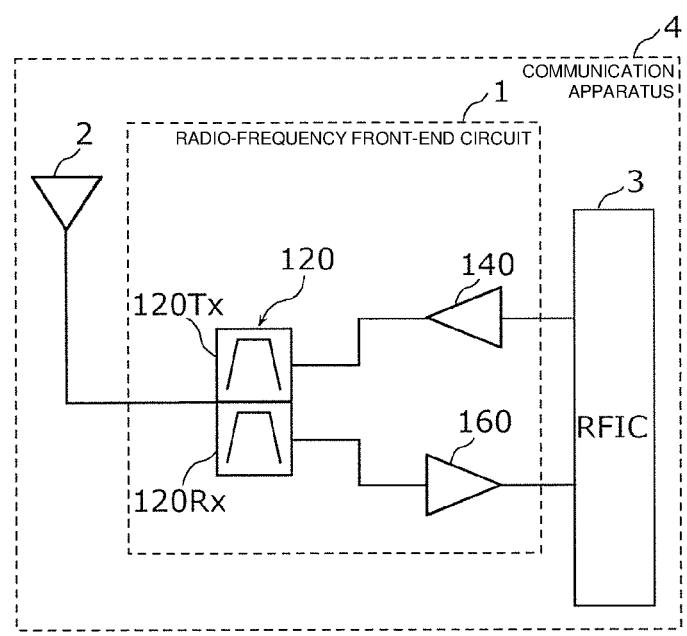
FIG. 15 is a configuration diagram of a radio-frequency front-end circuit according to a Preferred Embodiment 3 of the present invention and its peripheral circuit.

FIG. 15 is a configuration diagram of a radio-frequency front-end circuit 1 according to a Preferred Embodiment 3 of the present invention and its peripheral circuit. In FIG. 15, the radio-frequency front-end circuit 1, an antenna element 2, and an RF signal processing circuit (RFIC) 3 are illustrated. The radio-frequency front-end circuit 1, the antenna element 2, and the RFIC 3 define a communication apparatus 4. The antenna element 2, the radio-frequency front-end circuit 1, and the RFIC 3 are provided in a front-end portion of a multi-mode/multi-band cellular phone, for example.

The antenna element 2 is preferably, for example, a multi-band antenna used in a device complying with a communication standard such as 3GPP (Third Generation Partnership Project) and configured to transmit and receive radio-frequency signals. For example, the antenna element 2 may not support all of the bands of the communication apparatus 4, and may support only bands in a low-frequency band group or a high-frequency band group. Further, the antenna element 2 may not be included in the communication apparatus 4, but may be disposed separately from the communication apparatus 4.

The radio-frequency front-end circuit 1 transmits a radio-frequency signal between the antenna element 2 and the RFIC 3. Specifically, the radio-frequency front-end circuit 1 transmits a radio frequency transmission signal output from the RFIC 3 to the antenna element 2 via a transmission-side signal path. Further, the radio-frequency front-end circuit 1 transmits a radio frequency reception signal received by the antenna element 2 to the RFIC 3 via a reception-side signal path.

The radio-frequency front-end circuit 1 includes a duplexer 120, a transmission amplifier circuit 140, and a reception amplifier circuit 160.

The duplexer 120 is preferably, for example, a multiplexer including a transmission-side filter 120Tx and a reception-side filter 120Rx, at least one of which is provided with the acoustic wave filter device described above. Each of the transmission-side filter 120Tx and the reception-side filter 120Rx includes an antenna-side input/output terminal connected to the antenna element 2, and another terminal connected to the transmission amplifier circuit 140 or the reception amplifier circuit 160.

The transmission amplifier circuit 140 is a power amplifier that amplifies the power of a radio frequency transmission signal output from the RFIC 3.

The reception amplifier circuit 160 is a low-noise amplifier that amplifies the power of a radio frequency reception signal received by the antenna element 2.

The RFIC 3 is an RF signal processing circuit that processes a radio-frequency signal transmitted or received by the antenna element 2. Specifically, the RFIC 3 performs signal processing on a radio frequency reception signal input from the antenna element 2 via the reception-side signal path of the radio-frequency front-end circuit 1 using down-conversion, for example, to generate a reception signal, and outputs the reception signal to a baseband signal processing circuit (not illustrated). Further, the RFIC 3 performs signal processing on a transmission signal input from the baseband signal processing circuit using up-conversion, for example, to generate a radio frequency transmission signal, and outputs the radio frequency transmission signal to the transmission-side signal path of the radio-frequency front-end circuit 1.

The radio-frequency front-end circuit 1 having the configuration described above is provided with the acoustic wave filter device described above, and thus is able to achieve both low loss and high selectivity (prevention of mutual interference with other bands adjacent to its own band). This configuration is suitable for use in, in particular, the radio-frequency front-end circuit 1, which is applied to the communication apparatus 4 supporting multiple bands.

The filters (acoustic wave filter devices) provided in the Preferred Embodiments 1 and 2 described above and their modification are also applicable to a radio-frequency front-end circuit supporting a system that uses more bands than the radio-frequency front-end circuit 1 according to the Preferred Embodiment 3. In the present modification, such a radio-frequency front-end circuit will be described.

Figure 16:
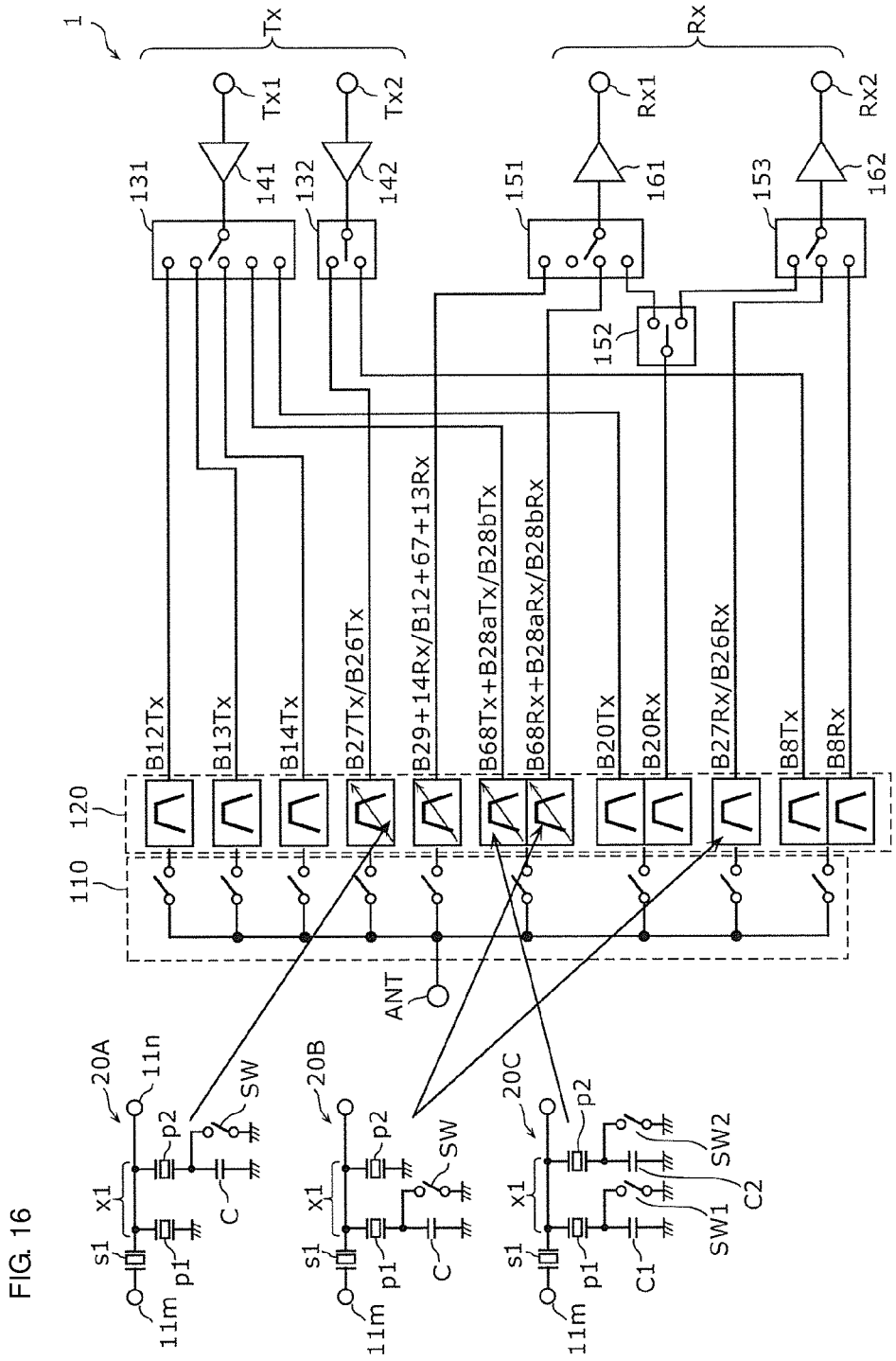
FIG. 16 is a configuration diagram of a radio-frequency front-end circuit according to a modification of the Preferred Embodiment 3 of the present invention.

FIG. 16 is a configuration diagram of a radio-frequency front-end circuit 1A according to a modification of Preferred Embodiment 3.

As illustrated in FIG. 16, the radio-frequency front-end circuit 1A includes an antenna terminal ANT, transmission terminals Tx1 and Tx2, and reception terminals Rx1 and Rx2. The radio-frequency front-end circuit 1A further includes, in sequence from the antenna terminal ANT side, a switch group 110 including a plurality of switches, a filter group 120 including a plurality of filters, transmission-side switches 131 and 132, reception-side switches 151, 152, and 153, transmission amplifier circuits 141 and 142, and reception amplifier circuits 161 and 162.

The switch group 110 connects the antenna terminal ANT and a signal path supporting a predetermined band in accordance with a control signal from a controller (not illustrated). The switch group 110 preferably includes, for example, a plurality of SPST switches. The number of signal paths to be connected to the antenna terminal ANT is not limited to one, and a plurality of signal paths may be connected to the antenna terminal ANT. That is, the radio-frequency front-end circuit 1A may support carrier aggregation.

The filter group 120 preferably includes, for example, a plurality of filters (including a duplexer) having the following bands as a pass band. Specifically, the bands are: (i) the transmission band of Band 12, (ii) the transmission band of Band 13, (iii) the transmission band of Band 14, (iv) the transmission band of Band 27 (or Band 26), (v) the reception bands of Band 29 and Band 14 (or Band 12, Band 67, and Band 13), (vi-Tx) the transmission bands of Band 68 and Band 28a (or Band 68 and Band 28b), (vi-Rx) the reception bands of Band 68 and Band 28a (or Band 68 and Band 28b), (vii-Tx) the transmission band of Band 20, (vii-Rx) the reception band of Band 20, (viii) the reception band of Band 27 (or Band 26), (ix-Tx) the transmission band of Band 8, and (ix-Rx) the reception band of Band 8.

The transmission-side switch 131 includes a plurality of selection terminals connected to a plurality of low-band transmission-side signal paths, and a common terminal connected to the transmission amplifier circuit 141. The transmission-side switch 132 includes a plurality of selection terminals connected to a plurality of high-band transmission-side signal paths, and a common terminal connected to the transmission amplifier circuit 142. The transmission-side switches 131 and 132 are disposed in the preceding stage of the filter group 120 (here, in the preceding stage in the transmission-side signal path) and are each configured such that the connection state is switched in accordance with a control signal from the controller (not illustrated). Accordingly, radio frequency transmission signals amplified by the transmission amplifier circuits 141 and 142 are output from the antenna terminal ANT to the antenna element 2 (see FIG. 15) via predetermined filters in the filter group 120.

The reception-side switch 151 includes a plurality of selection terminals connected to a plurality of low-band reception-side signal paths, and a common terminal connected to the reception amplifier circuit 161. The reception-side switch 152 includes a common terminal connected to a reception-side signal path for a predetermined band (here, Band 20), and two selection terminals connected to the selection terminal of the reception-side switch 151 and the selection terminal of the reception-side switch 153. The reception-side switch 153 includes a plurality of selection terminals connected to a plurality of high-band reception-side signal paths, and a common terminal connected to the reception amplifier circuit 162. The reception-side switches 151 to 153 are disposed in the subsequent stage of the filter group 120 (here, in the subsequent stage in the reception-side signal path) and are each configured such that the connection state is switched in accordance with a control signal from the control unit (not illustrated). Accordingly, radio frequency reception signals input to the antenna terminal ANT are amplified by the reception amplifier circuits 161 and 162 via predetermined filters in the filter group 120 and are output from the reception terminals Rx1 and Rx2 to the RFIC 3 (see FIG. 15). An RFIC supporting low bands and an RFIC supporting high bands may be separately provided.

The transmission amplifier circuit 141 is a power amplifier that amplifies the power of a low-band radio frequency transmission signal, and the transmission amplifier circuit 142 is a power amplifier that amplifies the power of a high-band radio frequency transmission signal.

The reception amplifier circuit 161 is a low-noise amplifier that amplifies the power of a low-band radio frequency reception signal, and the reception amplifier circuit 162 is a low-noise amplifier that amplifies the power of a high-band radio frequency reception signal.

The radio-frequency front-end circuit 1A having the configuration described above preferably includes the filter 20A according to the Application Example 1 of the Preferred Embodiment 2 as a filter having (iv) the transmission band of Band 27 (or Band 26) as a pass band. That is, this filter switches the pass band between the transmission band of Band 27 and the transmission band of Band 26 in accordance with a control signal.

Further, the radio-frequency front-end circuit 1A preferably includes the filter 20B according to the Application Example 2 of the Preferred Embodiment 2 as a reception filter having (vi-Rx) the reception bands of Band 68 and Band 28a (or Band 68 and Band 28b) as a pass band, and further includes the filter 20C according to the Application Example 3 of the Preferred Embodiment 2 as a transmission filter having (vi-Tx) the transmission bands of Band 68 and Band 28a (or Band 68 and Band 28b) as a pass band. That is, a duplexer defined by the transmission filter and the reception filter switches the pass band between the transmission bands and reception bands of Band 68 and Band 28a and the transmission bands and reception bands of Band 68 and Band 28b in accordance with a control signal.

Further, the radio-frequency front-end circuit 1A preferably includes the filter 20B according to the Application Example 2 of the Preferred Embodiment 2 as a filter having (viii) the reception band of Band 27 (or Band 26) as a pass band. That is, this filter switches the pass band between the reception band of Band 27 and the reception band of Band 26 in accordance with a control signal.

The radio-frequency front-end circuit 1A having the configuration described above preferably includes the filters 20A to 20C (acoustic wave filter devices) according to the Application Examples 1 to 3 of Preferred Embodiment 2 described above, which reduces the number of filters, compared with when a filter is disposed for each band, and thus is able to be reduced in size.

Furthermore, the radio-frequency front-end circuit 1A according to the present preferred embodiment includes the transmission-side switches 131 and 132 and the reception-side switches 151 to 153 (switch circuits) in the preceding stage or subsequent stage of the filter group 120 (a plurality of acoustic wave filter devices). This configuration enables some of signal paths along which radio-frequency signals are transmitted to be shared. Thus, for example, the transmission amplifier circuits 141 and 142 or the reception amplifier circuits 161 and 162 (amplifier circuits) corresponding to a plurality of acoustic wave filter devices are able to be shared. Accordingly, the size and cost of the radio-frequency front-end circuit 1A is able to be reduced.

At least one of the transmission-side switches 131 and 132 and at least one of the reception-side switches 151 to 153 may be provided. The number of transmission-side switches 131 and 132 and the number of reception-side switches 151 to 153 are not limited to those described above, and, for example, a single transmission-side switch and a single reception-side switch may be provided. In addition, the number of selection terminals of a transmission-side switch and a reception-side switch is not limited to that in the present preferred embodiment, and a transmission-side switch and a reception-side switch may each include two selection terminals.

Alternatively, the configurations of the filters according to the Preferred Embodiment 1 and its modification may be applied to at least one filter among a plurality of filters included in a filter group.

While acoustic wave filter devices and radio-frequency front-end circuits according to preferred embodiments of the present invention have been described with reference to the Preferred Embodiments 1 to 3 and modifications thereof, the present invention is not limited to the preferred embodiments and modifications described above. Any of the elements in the preferred embodiments and modifications described above may be combined to provide other preferred embodiments, or various modifications conceived by a person skilled in the art without departing from the gist of the present invention may be made to the preferred embodiments. Such preferred embodiments and modifications and various devices including acoustic wave filter devices and radio-frequency front-end circuits according to preferred embodiments of the present invention are also included in the present invention.

For example, the communication apparatus 4 including the radio-frequency front-end circuit described above and the RFIC 3 (RF signal processing circuit) is also included in preferred embodiments of the present invention. The communication apparatus 4 having the configuration described above is able to achieve low loss and high selectivity.

Furthermore, the IDT electrodes in the series-arm resonator s1 and the parallel-arm resonators p1 and p2 may have the same or different duty ratios. However, in terms of improved filter characteristics, the duty ratio of the IDT electrode 131 in the parallel-arm resonator p2 is preferably higher than the duty ratio of the IDT electrode 121 in the parallel-arm resonator p1.

Figure 17:
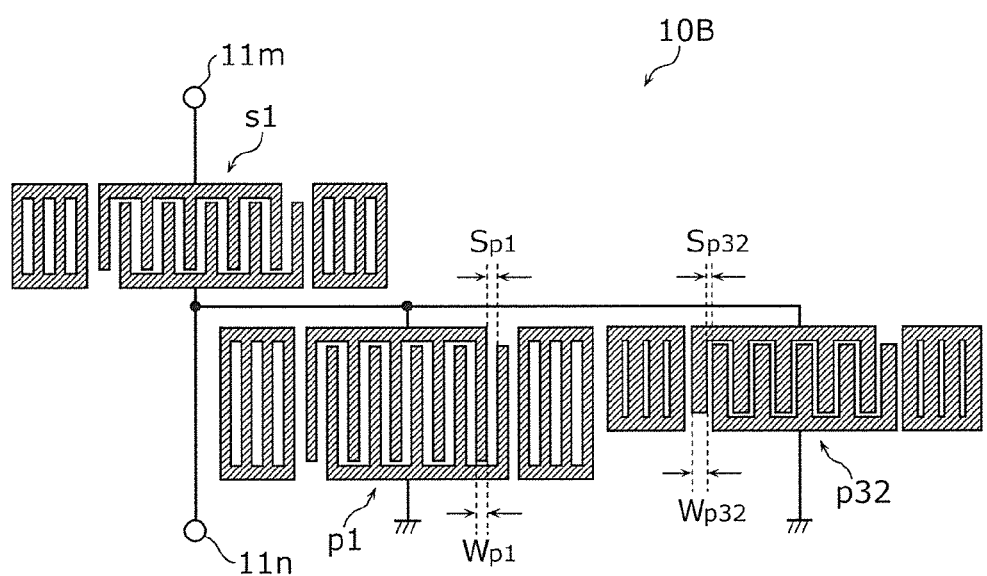
FIG. 17 is a schematic plan view of an electrode structure of a filter according to another preferred embodiment of the present invention.

FIG. 17 is a schematic plan view of an electrode structure of a filter 10B having the configuration described above.

As illustrated in FIG. 17, an IDT electrode in a parallel-arm resonator p32 (second parallel-arm resonator) has a higher duty ratio than the IDT electrode 121 in the parallel-arm resonator p1 (first parallel-arm resonator), where the duty ratio is the ratio of the width of a plurality of electrode fingers to the pitch of the plurality of electrode fingers. Specifically, the width of a plurality of electrode fingers of the IDT electrode 121 of the parallel-arm resonator p1 is denoted by $W_{p1}$, and the width of the space between adjacent electrode fingers is denoted by $S_{p1}$. The width of electrode fingers of the IDT electrode 331 of the parallel-arm resonator p32 is denoted by $W_{p32}$, and the width of the space between adjacent electrode fingers is denoted by $S_{p32}$. In this case, the duty ratio of the IDT electrode 331, which is given by $W_{p32}/(W_{p32}+S_{p32})$, is higher than the duty ratio of the IDT electrode 121), which is given by $W_{p1}/(W_{p1}+S_{p1})$. That is, the IDT electrode 331 in the parallel-arm resonator p32 has a lower aspect ratio and a higher duty ratio than the IDT electrode 121 in the parallel-arm resonator p1.

The inventor of preferred embodiments of the present invention has discovered that the change in the Qs at the resonant frequency and the anti-resonant frequency of a resonator depends not only on the aspect ratio of an IDT electrode in the resonator but also on the duty ratio of the IDT electrode in the resonator, which may be utilized to improve filter characteristics. That is, for impedance characteristics of a resonator alone, the lower the aspect ratio and the higher the duty ratio of the IDT electrode, the higher the Q at the resonant frequency becomes. Conversely, the higher the aspect ratio and the lower the duty ratio of the IDT electrode, the higher the Q at the anti-resonant frequency becomes. For filter characteristics, as the Q at the resonant frequency of the parallel-arm resonator p32 and the Q at the anti-resonant frequency of the parallel-arm resonator p1 increases, a lower loss within the pass band is able to be achieved and the sharpness on the high-frequency side of the pass band can be improved. Accordingly, the duty ratio of the IDT electrode in the parallel-arm resonator p32 is set to be higher than the duty ratio of the IDT electrode in the parallel-arm resonator p1, and the aspect ratio of the IDT electrode in the parallel-arm resonator p32 is set to be lower than the aspect ratio of the IDT electrode in the parallel-arm resonator p1. This achieves lower loss within the pass band and further improved sharpness on the high-frequency side of the pass band.

Furthermore, the series-arm resonator s1 is not limited to an acoustic wave resonator that uses a surface acoustic wave, and may be, for example, an acoustic wave resonator that uses a bulk wave or a boundary acoustic wave. That is, the series-arm resonator s1 may not include an IDT electrode. Even an acoustic wave filter device including the series-arm resonator s1 having this configuration is able to achieve both low loss and high selectivity (prevention of mutual interference with other bands adjacent to its own band) since an acoustic wave resonator generally has a high-Q characteristic.

Furthermore, the aspect ratio of the IDT electrode 111 in the series-arm resonator s1 may be equal to or higher than that of an IDT electrode in a second parallel-arm resonator (in the foregoing description, the IDT electrode 131 in the parallel-arm resonator p2 or the IDT electrode 331 in the parallel-arm resonator p32). Moreover, the aspect ratio of the IDT electrode 111 in the series-arm resonator s1 may be equal to or higher than that of the IDT electrode 121 in the parallel-arm resonator p1 (first parallel-arm resonator).

Furthermore, in terms of low loss, each resonator preferably includes reflectors. However, for example, if there are constraints on the mounting layout and other parameters, a resonator may not include a reflector.

Furthermore, for example, in a radio-frequency front-end circuit or a communication apparatus, an inductor or a capacitor may be connected between individual components. The inductor may include a wiring inductor using wiring that connects individual components.

Preferred embodiments of the present invention provide compact filters, multiplexers, front-end circuits, and communication apparatuses applicable to a multi-band system, which may be widely used in communication devices, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
   a series-arm resonant circuit that is connected on a path connecting a first input/output terminal and a second input/output terminal; and
   a first parallel-arm resonator and a second parallel-arm resonator that are connected between a same node on the path and ground; wherein
   a resonant frequency of the second parallel-arm resonator is higher than a resonant frequency of the first parallel-arm resonator;
   an anti-resonant frequency of the second parallel-arm resonator is higher than an antiresonant frequency of the first parallel-arm resonator;
   each of the first parallel-arm resonator and the second parallel-arm resonator is defined by an acoustic wave resonator including an IDT electrode;
   the IDT electrode in the second parallel-arm resonator has a lower aspect ratio than the IDT electrode in the first parallel-arm resonator, the aspect ratio being a ratio of an overlap width of a plurality of electrode fingers to a number of pairs of electrode fingers included in the respective IDT electrodes; and
   the number of pairs of the electrode fingers of the IDT electrode in the second parallel arm resonator is larger than the number of pairs of the electrode fingers of the IDT electrode in the first parallel-arm resonator, such that the aspect ratio of the IDT electrode in the second parallel-arm resonator is lower than the aspect ratio of the IDT electrode in the first parallel arm resonator.

2. The acoustic wave filter device according to claim 1, wherein the overlap width of the IDT electrode in the second parallel-arm resonator is smaller than the overlap width of the IDT electrode in the first parallel-arm resonator, such that the aspect ratio of the IDT electrode in the second parallel-arm resonator is lower than the aspect ratio of the IDT electrode in the first parallel-arm resonator.

3. The acoustic wave filter device according to claim 1, wherein the series-arm resonant circuit includes a series-arm resonator including a single acoustic wave resonator, and the series-arm resonant circuit, the first parallel-arm resonator, and the second parallel-arm resonator define a ladder filter structure.

4. The acoustic wave filter device according to claim 1, wherein
the series-arm resonant circuit includes an acoustic wave resonator including an IDT electrode; and
an aspect ratio of the IDT electrode in the series-arm resonant circuit is lower than the aspect ratio of the IDT electrode in the first parallel-arm resonator.

5. The acoustic wave filter device according to claim 4, wherein
the aspect ratio of the IDT electrode in the series-arm resonant circuit is higher than the aspect ratio of the IDT electrode in the second parallel-arm resonator.

6. The acoustic wave filter device according to claim 1, further comprising:
an impedance circuit in which an impedance element and a switch element are connected in parallel; wherein
at least one of the first parallel-arm resonator and the second parallel-arm resonator is connected in series with the impedance circuit.

7. The acoustic wave filter device according to claim 6, wherein
the second parallel-arm resonator is connected in series with the impedance circuit; and
the first parallel-arm resonator is connected in parallel to a circuit in which the second parallel-arm resonator and the impedance circuit are connected in series.

8. The acoustic wave filter device according to claim 6, wherein
the first parallel-arm resonator is connected in series with the impedance circuit; and
the second parallel-arm resonator is connected in parallel to a circuit in which the first parallel-arm resonator and the impedance circuit are connected in series.

9. The acoustic wave filter device according to claim 6, wherein
the first parallel-arm resonator and the second parallel-arm resonator are connected in parallel; and
the impedance circuit is connected in series with a circuit including the first parallel-arm resonator and the second parallel-arm resonator connected in parallel.

10. The acoustic wave filter device according to claim 1, further comprising:
two impedance circuits each including an impedance element and a switch element that are connected in parallel; wherein
the first parallel-arm resonator is connected in series with one of the two impedance circuits;
the second parallel-arm resonator is connected in series with another of the two impedance circuits; and
a circuit including the first parallel-arm resonator and the one impedance circuit connected in series and a circuit including the second parallel-arm resonator and the another impedance circuit connected in series are connected in parallel.

11. The acoustic wave filter device according to claim 1, further comprising:
a switch element connected in parallel to one of the first and second parallel-arm resonators; wherein
another of the first and second parallel-arm resonators is connected in series with a circuit including the one parallel-arm resonator and the switch element connected in parallel.

12. The acoustic wave filter device according to claim 1, wherein the IDT electrode in the second parallel-arm resonator has a higher duty ratio than the IDT electrode in the first parallel-arm resonator, the duty ratio being a ratio of a width of the plurality of electrode fingers to a pitch of the plurality of electrode fingers included in the IDT electrodes.

13. The radio-frequency front-end circuit according to claim 1, wherein
the series-arm resonant circuit includes an acoustic wave resonator including an IDT electrode; and
an aspect ratio of the IDT electrode in the series-arm resonant circuit is lower than the aspect ratio of the IDT electrode in the first parallel-arm resonator.

14. The radio-frequency front-end circuit according to claim 13, wherein
the aspect ratio of the IDT electrode in the series-arm resonant circuit is higher than the aspect ratio of the IDT electrode in the second parallel-arm resonator.

15. A radio-frequency front-end circuit comprising:
the acoustic wave filter device according to claim 1; and
an amplifier circuit connected to the acoustic wave filter device.

16. The radio-frequency front-end circuit according to claim 15, wherein the overlap width of the IDT electrode in the second parallel-arm resonator is smaller than the overlap width of the IDT electrode in the first parallel-arm resonator, such that the aspect ratio of the IDT electrode in the second parallel-arm resonator is lower than the aspect ratio of the IDT electrode in the first parallel-arm resonator.

17. A communication apparatus comprising:
an RF signal processing circuit that processes a radio-frequency signal transmitted or received by an antenna element; and
the radio-frequency front-end circuit according to claim 15 that transmits the radio-frequency signal between the antenna element and the RF signal processing circuit.

18. The acoustic wave filter device according to claim 1, wherein the series-arm resonant circuit includes a longitudinally coupled resonator including a plurality of acoustic wave resonators.

* * * * *